(12) United States Patent
Chen et al.

(10) Patent No.: US 8,530,259 B2
(45) Date of Patent: Sep. 10, 2013

(54) METHOD AND STRUCTURE FOR FORMING A GYROSCOPE AND ACCELEROMETER

(75) Inventors: Dongmin Chen, Saratoga, CA (US); Justin Payne, San Jose, CA (US); Li-Tien Tseng, Taoyuan County (TW)

(73) Assignee: Miradia Inc., Santa Clara, CA (US)

( * ) Notice: Subject to any disclaimer, the term of this patent is extended or adjusted under 35 U.S.C. 154(b) by 0 days.

(21) Appl. No.: 13/480,351

(22) Filed: May 24, 2012

(65) Prior Publication Data

US 2012/0228727 A1 Sep. 13, 2012

Related U.S. Application Data

(60) Division of application No. 12/620,872, filed on Nov. 18, 2009, now Pat. No. 8,207,004, which is a continuation-in-part of application No. 11/670,362, filed on Feb. 1, 2007, now Pat. No. 7,670,880.

(60) Provisional application No. 61/116,283, filed on Nov. 19, 2008.

(51) Int. Cl.
*H01L 21/00* (2006.01)

(52) U.S. Cl.
USPC .............................................. 438/50; 438/51

(58) Field of Classification Search
USPC ....... 438/50–54; 257/417, E29.324, E21.002
See application file for complete search history.

(56) References Cited

U.S. PATENT DOCUMENTS

| | | | |
|---|---|---|---|
| 4,229,732 A | 10/1980 | Hartstein et al. | |
| 4,317,611 A | 3/1982 | Petersen | |
| 4,566,935 A | 1/1986 | Hornbeck | |
| 4,615,595 A | 10/1986 | Hornbeck | |
| 5,061,049 A | 10/1991 | Hornbeck | |
| 5,170,283 A | 12/1992 | O'Brien et al. | |
| 5,172,262 A | 12/1992 | Hornbeck | |

(Continued)

FOREIGN PATENT DOCUMENTS

| EP | 1237032 A2 | 9/2002 |
|---|---|---|
| WO | 03/068669 | 8/2003 |

OTHER PUBLICATIONS

Henley et al., "A New SOI Manufacturing Technology Using Atomic layer Cleaving." Silicon Genesis Corporation Campbell CA (1999) pp. 1-5.

(Continued)

*Primary Examiner* — Chuong A Luu
*Assistant Examiner* — Nga Doan
(74) *Attorney, Agent, or Firm* — Kilpatrick Townsend & Stockton LLP

(57) ABSTRACT

A method for fabricating a micro electromechanical device includes providing a first substrate including control circuitry. The first substrate has a top surface and a bottom surface. The method also includes forming an insulating layer on the top surface of the first substrate, removing a first portion of the insulating layer so as to form a plurality of standoff structures, and bonding a second substrate to the first substrate. The method further includes thinning the second substrate to a predetermined thickness and forming a plurality of trenches in the second substrate. Each of the plurality of trenches extends to the top surface of the first substrate. Moreover, the method includes filling at least a portion of each of the plurality of trenches with a conductive material, forming the micro electromechanical device in the second substrate, and bonding a third substrate to the second substrate.

13 Claims, 31 Drawing Sheets

(56) References Cited

U.S. PATENT DOCUMENTS

| | | | |
|---|---|---|---|
| 5,311,360 A | 5/1994 | Bloom et al. |
| 5,382,961 A | 1/1995 | Gale, Jr. |
| 5,448,314 A | 9/1995 | Heimbuch et al. |
| 5,452,024 A | 9/1995 | Sampsell |
| 5,489,952 A | 2/1996 | Gove et al. |
| 5,504,614 A | 4/1996 | Webb et al. |
| 5,535,047 A | 7/1996 | Hornbeck |
| 5,583,688 A | 12/1996 | Hornbeck |
| 5,589,852 A | 12/1996 | Thompson et al. |
| 5,600,383 A | 2/1997 | Hornbeck |
| 5,661,591 A | 8/1997 | Lin et al. |
| 5,663,749 A | 9/1997 | Farris et al. |
| 5,742,419 A | 4/1998 | Dickensheets et al. |
| 5,757,536 A | 5/1998 | Ricco et al. |
| 5,798,557 A | 8/1998 | Salatino et al. |
| 5,835,256 A | 11/1998 | Huibers |
| 5,999,306 A | 12/1999 | Atobe et al. |
| 6,038,056 A | 3/2000 | Florence et al. |
| 6,046,840 A | 4/2000 | Huibers |
| 6,049,317 A | 4/2000 | Thompson et al. |
| 6,172,797 B1 | 1/2001 | Huibers |
| 6,201,521 B1 | 3/2001 | Doherty |
| 6,252,277 B1 | 6/2001 | Chan et al. |
| 6,323,982 B1 | 11/2001 | Hornbeck |
| 6,337,760 B1 | 1/2002 | Huibers et al. |
| 6,356,378 B1 | 3/2002 | Huibers |
| 6,388,661 B1 | 5/2002 | Richards |
| 6,396,619 B1 | 5/2002 | Huibers et al. |
| 6,429,033 B1 * | 8/2002 | Gee et al. ............... 438/48 |
| 6,489,241 B1 | 12/2002 | Thilderkvist et al. |
| 6,529,310 B1 | 3/2003 | Huibers et al. |
| 6,538,800 B2 | 3/2003 | Huibers |
| 6,542,653 B2 | 4/2003 | Wu et al. |
| 6,543,286 B2 | 4/2003 | Garverick et al. |
| 6,642,913 B1 | 11/2003 | Kimura et al. |
| 6,808,954 B2 * | 10/2004 | Ma et al. ............... 359/295 |
| 6,809,852 B2 | 10/2004 | Tao et al. |
| 7,172,921 B2 | 2/2007 | Yang et al. |
| 7,670,880 B2 | 3/2010 | Yang et al. |
| 8,207,004 B2 | 6/2012 | Chen et al. |
| 2002/0024483 A1 | 2/2002 | Makino |
| 2002/0041455 A1 | 4/2002 | Sawada et al. |
| 2002/0071166 A1 | 6/2002 | Jin et al. |
| 2002/0071169 A1 | 6/2002 | Bowers et al. |
| 2002/0132389 A1 | 9/2002 | Patel et al. |
| 2003/0030118 A1 | 2/2003 | Kim |
| 2003/0117686 A1 | 6/2003 | DiCarlo |
| 2004/0004753 A1 | 1/2004 | Pan |
| 2004/0008402 A1 | 1/2004 | Patel et al. |
| 2004/0125347 A1 | 7/2004 | Patel et al. |
| 2004/0126920 A1 * | 7/2004 | An et al. ............... 438/50 |
| 2004/0136044 A1 | 7/2004 | Miller et al. |
| 2004/0184133 A1 | 9/2004 | Su et al. |
| 2004/0190817 A1 | 9/2004 | Aubuchon |
| 2004/0214350 A1 | 10/2004 | Pan et al. |
| 2005/0009233 A1 | 1/2005 | Park et al. |
| 2005/0041277 A1 | 2/2005 | Huibers |
| 2005/0052725 A1 | 3/2005 | Niklaus et al. |
| 2005/0157370 A1 | 7/2005 | Chen |

OTHER PUBLICATIONS

Petersen, K.E., Micromechanical Light Modulator Array Fabricated on Silicon. Applied Physics Letters. vol. 31 No. 8 (Oct. 15, 1977) pp. 521-523.

Petersen, K.E., Micromechanical Membrane Switches On Silicon. IBM J. Res. Develop., vol. 23, No. 4 (Jul. 1979) pp. 376-385.

* cited by examiner

METHOD AND STRUCTURE FOR FORMING A GYROSCOPE AND ACCELEROMETER

CROSS-REFERENCES TO RELATED APPLICATIONS

The present application is a division of U.S. patent application Ser. No. 12/620,872, filed on Nov. 18, 2009, which claims priority to U.S. Provisional Patent Application No. 61/116,283, filed on Nov. 19, 2008, the disclosure of both these applications are hereby incorporated by reference in their entirety for all purposes, U.S. patent application Ser. No. 12/620,872 is a continuation-in-part of U.S. patent application Ser. No. 11/670,362, filed Feb. 1, 2007, which claims priority to U.S. patent application Ser. No. 11/028,946, filed Jan. 3, 2005, the disclosures of these applications are hereby incorporated by reference in their entirety for all purposes.

BACKGROUND

Many portable media devices and gaming systems are increasingly being manufactured with integrated accelerometers and/or gyroscopes. The accelerometer and gyroscope provide the ability to sense motion and orientation of the device that incorporates them. This, in turn, enables the manufacturer and the application providers for such portable media devices and/or the gaming systems to offer enhanced features for these devices.

In the gaming system area, the integrated accelerometers and gyroscopes have opened up a new area of gaming applications that utilize motion sensing to offer an enhanced level of game play that approaches reality. In the portable media device area, accelerometers and gyroscopes have enabled use of features like shaking to change media tracks, bumping media players to share contacts and other information, adjusting screen orientation based on the position, etc.

SUMMARY OF THE INVENTION

According to the present invention semiconductor processing techniques are provided. More particularly, the invention includes a method and structure for fabricating accelerometers and/or gyroscopes using Micro-electro-mechanical structures (MEMS). Merely by way of example, the invention has been applied to a method of fabricating MEMS useful for motion sensing applications. The method and structure can be applied to other applications as well, such as actuators, sensors, and detectors.

In a specific embodiment of the present invention, a method of fabricating a micro electromechanical device is provided. The method includes providing a first substrate including control circuitry. The first substrate has a top surface and a bottom surface. The method also includes forming an insulating layer on the top surface of the first substrate, removing a first portion of the insulating layer so as to form a plurality of standoff structures, and bonding a second substrate to the first substrate. The second substrate has an upper surface and a lower surface. The method also includes thinning the second substrate to a predetermined thickness and forming a plurality of trenches in the second substrate. Each of the plurality of trenches extending to the top surface of the first substrate. Moreover, the method includes filling at least a portion of each of the plurality of trenches with a conductive material, forming the micro electromechanical device in the second substrate, and bonding a third substrate to the second substrate.

According to another embodiment of the present invention, a micro-electromechanical device is provided. The micro-electromechanical device includes a CMOS substrate having an upper surface and a lower surface and including control circuitry disposed in an upper portion of the CMOS substrate and a plurality of posts coupled to the upper surface of the CMOS substrate and extending in a direction normal to the upper surface of the CMOS substrate. Each of the plurality of posts has a bonding region. The micro-electromechanical device also includes a second substrate bonded to the plurality of posts. The second substrate has a top surface and a bottom surface in contact with the bonding region of each of the plurality of posts and at least a portion of the micro-electromechanical device is disposed in the second substrate. The micro-electromechanical device further includes a plurality of trenches extending from the top surface of the second substrate to the upper surface of the CMOS substrate. The trenches pass through the plurality of posts. Moreover, the micro-electromechanical device includes a cover substrate bonded to the top surface of the second substrate. The cover substrate includes a recessed region overlaying the at least a portion of the micro-electromechanical device.

According to yet another embodiment of the present invention, a method for fabricating a micro electromechanical device is provided. The method includes providing a first substrate including control circuitry. The first substrate has a first surface and an opposing second surface. The method also includes providing a second substrate having a top surface and a bottom surface, removing a portion of the second substrate along the bottom surface to form a plurality of standoff structures, and bonding the first substrate to the second substrate. The first surface of the first surface is in contact with the standoff structures of the second substrate. The method further includes thinning the second substrate to a predetermined thickness. Thinning includes removing a portion of the second substrate along the top surface of the second substrate. Morevoer, the method include forming a plurality of trenches in the second substrate. The plurality of trenches extend from the top surface of the second substrate to the first surface of the first substrate. Additionally, the method includes forming a portion of one or more micro electromechanical devices in the second substrate and bonding a third substrate to the second substrate According to a specific embodiment of the present invention, a method of fabricating a device is provided. The method includes providing a CMOS substrate having one or more electrodes and control circuitry formed in proximity to a first surface, forming a first photosensitive layer over the first surface of the CMOS substrate, and patterning and etching the first photosensitive layer to form a first trench. The first trench extends to a first electrode from among the one or more electrodes. The method also includes removing a remaining portion of the first photosensitive layer and forming a second photosensitive layer over the first substrate. A portion of the second photosensitive layer overlays the first trench. The method further includes etching the second photosensitive layer and a portion of the first substrate to define a plurality of standoff structures and attaching a second substrate to the first substrate. The second substrate has an upper surface and a lower surface. Moreover, the method includes thinning the second substrate to a predetermined thickness. forming a third photosensitive layer over the upper surface of the second substrate, and etching the third photosensitive layer and a portion of the second substrate to define a second trench. The second trench is aligned with the first trench and the second trench merges with the first trench to form a continuous trench extending from the upper surface of the second substrate to the first electrode. Additionally, the method includes forming a conformal adhesion layer over the upper surface of the second substrate and over sidewalls of the continuous trench, forming a conformal barrier layer over the adhesion layer, filling the continuous trench with a conductive material, forming a passivation layer over the barrier layer, and patterning and etching a portion of the second substrate to form a micro-electromechanical device.

Numerous benefits are achieved using the present invention over conventional techniques. For example, embodiments of the present invention provide a shortened interconnect between sensing elements and sensing circuitry in comparison with conventional designs. As a result, parasitic effects are reduced, resulting in higher signal-to-noise ratios than other designs. Additionally, embodiments of the present invention provide implementations suitable for use with differential sensing circuitry. Moreover, in some embodiments, monolithic integration of the control/sensing circuitry and the MEMS structures in the vertical configurations described herein provides for a reduction or elimination in wire bonding between a central control chip and the elements of the accelerometer.

In embodiments of the present invention, the use of sacrificial layers and materials is reduced or eliminated, enabling the proof mass area to be increased in comparison with conventional designs that form holes in the proof mass in order to enable reaction product gases and effluents to be removed from the structure during fabrication. Because the proof mass area is increased, the mass of the proof mass is also increased, resulting in higher sensitivity for a given device size.

These and other embodiments of the invention along with many of its advantages and features are described in more detail in conjunction with the text below and attached figures.

DETAILED DESCRIPTION OF SPECIFIC EMBODIMENTS

According to the present invention semiconductor processing techniques are provided. More particularly, the invention includes a method and structure for forming accelerometers and gyroscopes based on MEMS fabrication techniques. Merely by way of example, the invention has been applied to a method of forming accelerometers and gyroscopes using a monolithic integration process, thereby reducing the die footprint by at least a factor of two. The method and structure can be applied to other applications as well, such as actuators, sensors, and detectors.

Figure 1A:
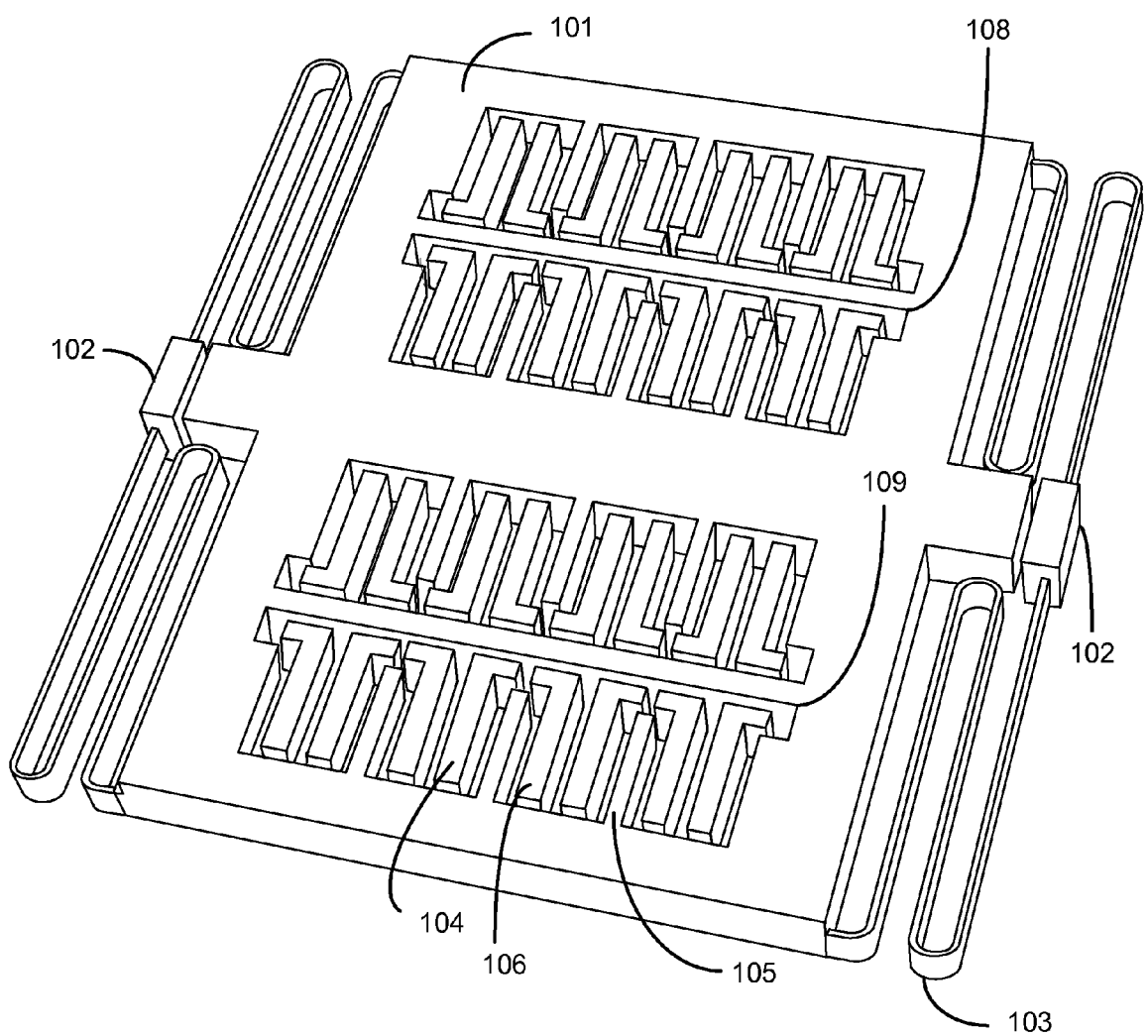
FIG. 1A is a perspective illustration of an accelerometer according to an embodiment of the present invention.

FIG. 1A is a perspective illustration of an accelerometer useful for measuring motion along one axis of a three axis accelerometer system. For example, FIG. 1A illustrates the X or Y axis of an accelerometer according to an embodiment of the present invention. As illustrated in FIG. 1A, the accelerometer includes a proof mass plate 101. Proof mass plate 101 is coupled to anchor points 102 via one or more springs 103. Proof mass 101 includes cut-outs for combs 108 and 109. Each comb 108 and 109 includes a fixed number of movable proof mass comb fingers 105 and a fixed number of non-moving stator comb finger pairs 104 and 106. Each of the movable proof mass comb fingers 105 is interlaced between a pair of stator comb fingers 104, 106. Stator comb fingers 104 and 106 are anchored to the underlying substrate at a predetermined location with the rest of the stator comb fingers 104 and 106 overlying a cavity formed in the substrate underneath. In one embodiment, stator comb fingers 104 and 106 are anchored at a location proximate to an end section of each stator comb finger.

Spring 103 is attached to anchor points 102 and proof mass 101 at one or more locations. In some embodiments, spring 103 is arranged in a manner such that the spring member includes multiple folds as it travels between one or more anchor points 102 and proof mass 101. In some embodiments, spring 103 has between 10 and 20 folds. In one embodiment spring 103 has 17 folds. In some embodiments, thickness of the spring member is between 2 microns and 3 microns with a pitch of between 2 microns and 2.5 microns. Spring 103 serves as a motion limiter for proof mass 101. Proof mass 101 is capable of moving laterally along the line between the two anchor points. In operation, under the influence of external acceleration, proof mass 101 deflects from its neutral position. This results in proof mass comb finger 105 moving closer to either stator comb finger 104 or stator comb finger 106 depending on the direction of motion of proof mass 101. As a result, the capacitance between stator comb finger 104, 106 and proof mass comb finger 105 changes. This differential change of capacitance is measured to determine the amount of acceleration.

FIG. 1A represents one axis of the accelerometer. Two such structures can be integrated perpendicular to each other on a single die to create the two axes of an accelerometer, e.g., the x and y axes. A third out-of-plane structure can be added to the same die to measure acceleration in the z-direction thus creating a 3-axis accelerometer.

Figure 1B:
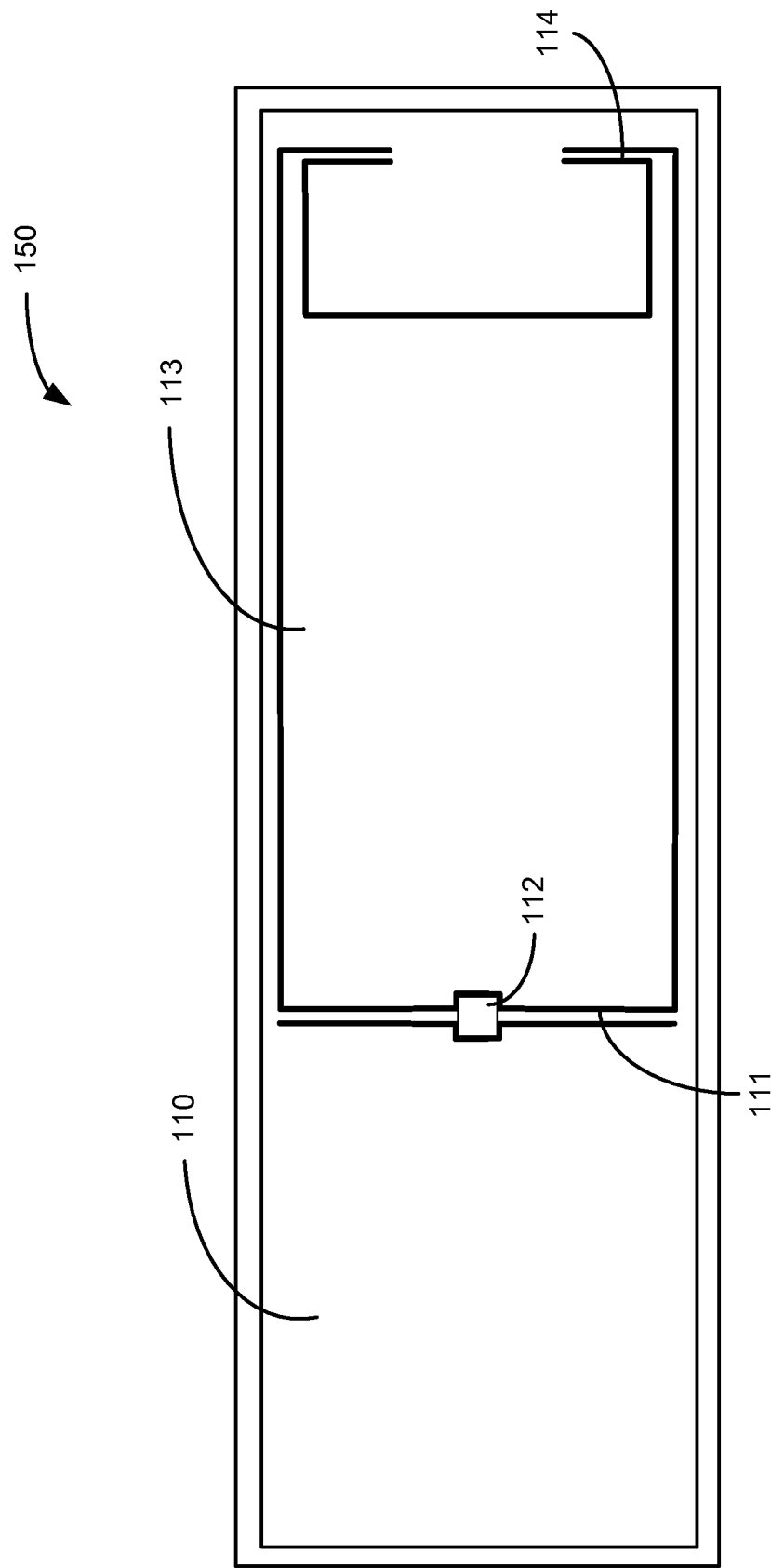
FIG. 1B is a simplified plan view of an accelerometer according to another embodiment of the present invention.

FIG. 1B is a simplified plan view of an accelerometer according to another embodiment of the present invention. As shown in FIG. 1B, a plan view of a structure 150 is illustrated that can be used to measure acceleration in the z-direction according to an embodiment of the present invention. Structure 150 includes an anchor 112 that provides support to two proof mass plates 110 and 113. Torsion springs 111 and 114 act as motion limiters for proof mass plates 110 and 113, respectively. A plurality of sense electrodes are located below proof mass plates 110 and 113. In operation, proof mass plates 110 and 113 move in a vertical direction but opposing each other. For example, if proof mass plates 110 moves in an upward direction, proof mass plate 113 moves in a downward direction. The difference in capacitance between the two proof mass plates is measured to determine the amount of acceleration in the z direction. As described above, structure 150 can be integrated with the structure illustrated in FIG. 1A on a single die to form a 3-axis accelerometer.

It is to be noted that the above-description relates to an accelerometer. Other structures can be used to form a gyroscope.

Because of the 3D architecture of the accelerometer, in which the moving components are positioned vertically over the control electronics, the die count per wafer can be increased by a factor or two or more, resulting in decreased fabrication costs, smaller package sizes, and the like.

FIGS. 2A-2J are simplified schematic side view illustrations showing a method of fabricating a packaged accelerometer according to an embodiment of the present invention. The fabrication method starts with a CMOS substrate 200. The CMOS substrate includes drive electronics, sense electronics, and the like. Typically implemented using ASIC design elements, analog and/or digital circuits can be utilized in the CMOS substrate. The CMOS substrate 200 can also be referred to as an electrode substrate. Although a single device is illustrated in these cross-sectional views, it will be appreciated that multiple dies are fabricated on a single substrate. Thus, the single device illustrated in these figures is only representative and is not intended to limit the present invention to fabrication methods for a single device. As described more fully below, wafer-scale processing is utilized to fabricate multiple dies or devices per substrate. After fabrication of the devices, dicing and singulation techniques are utilized to produce single device packages for use in various applications.

The CMOS substrate 200 is an integrated circuit device having a plurality of electrode devices 201 as shown. The integrated circuit device can include drive devices coupled to each of the electrodes (not shown). In one application, the drive devices include CMOS circuitry fabricated in processing steps (not shown) prior to the formation of the plurality of electrode devices 201. The drive devices can be used to apply voltages to the electrodes to actuate and/or sense motion of selected mechanical elements fabricated in a device substrate, discussed in more detail below. The sensing/drive circuits including electrodes and interconnects are fabricated using CMOS technology in order to leverage existing CMOS device capabilities. Preferably, the CMOS substrate is made using a silicon wafer or other like substrate material. Additional details of the fabrication processes for the CMOS substrate are provided in commonly owned U.S. Pat. No. 7,022, 245, filed Jan. 13, 2004, which is hereby incorporated by reference for all purposes.

Figure 2A:
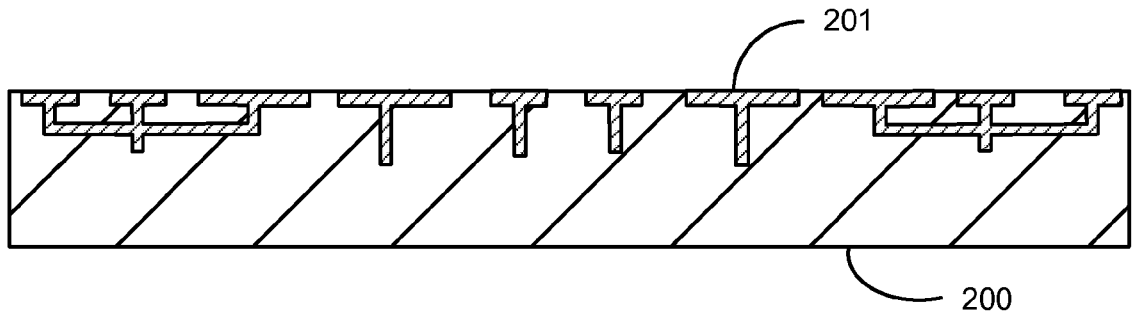
FIGS. 2A-2J show cross-sectional views of a micro electromechanical (MEMS) device during the fabrication process according to an embodiment of the present invention.
Figure 2B:
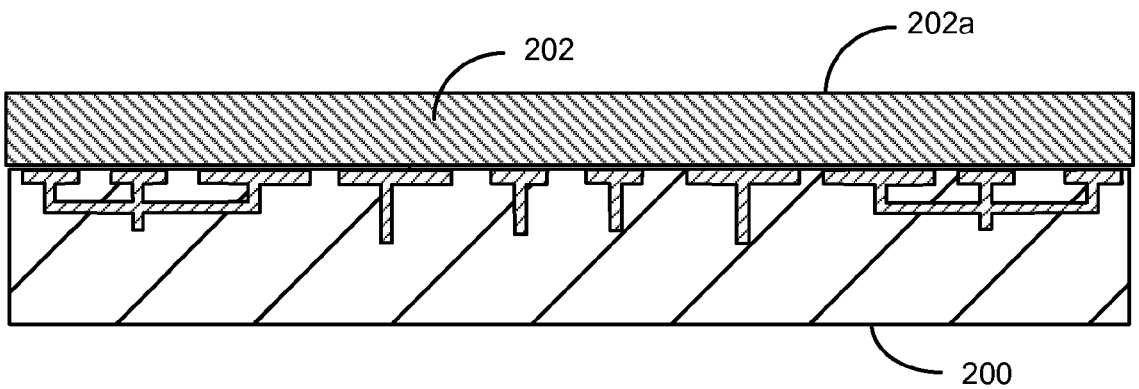

As illustrated in the FIG. 2B, layer 202, with a predetermined thickness, is deposited on CMOS substrate 200. Layer 202 is a silicon dioxide ($SiO_2$) layer in a specific embodiment of the present invention, but this is not required by the present invention. Other suitable materials may be used within the scope of the present invention. For example, layer 202 is formed by deposition of silicon nitride ($Si_3N_4$) or silicon oxynitride (SiON) layers in alternative embodiments. Moreover, polysilicon material, including amorphous polysilicon, is deposited to form layer 202 in yet another alternative embodiment according to the present invention. Materials with suitable characteristics, including formation of a strong bond with the CMOS substrate, good adhesion to substrate 200, and mechanical rigidity, are acceptable substitutes for $Si_xO_y$ materials.

The deposited layer 202 has a predetermined thickness as initially deposited. In a specific embodiment, the initial thickness is about 2 μm. In other embodiments, the thickness ranges from about 0.5 μm to about 3 μm. Of course, the thickness will depend on the particular applications. In some embodiments, the layer 202 is formed using multiple deposition and polishing steps to form the final layer. As an example, an HDP deposition process could be used to form a first portion of the layer, which is then polished using CMP. Because the device features have varying density as a function of lateral position, the deposited layers may not have a uniform upper surface. Thus, using a multi-step deposition/polish process, a flat and uniform surface can be fabricated. Examples of deposition techniques include TEOS, HDP, CVD, LPCVD, and the like. Additionally, other materials could be utilized that are capped with a final layer, for example, oxide.

As illustrated in FIG. 2B, the upper surface 202a of the deposited layer 202 is uniform across the CMOS substrate 200, resulting in a planar surface. As discussed above, a planar surface after the deposition steps is not required by the present invention since polishing steps can be utilized.

The upper surface 202a of the deposited layer is flattened using a CMP process. The results produced by the CMP process are illustrated by the planar upper surface 202a illustrated in FIG. 2B. In a particular embodiment, the root-mean-square (RMS) roughness of the planarized surface 202a is less than or equal to about 10-30 Å. As will be described below, the extremely smooth surface produced during the CMP process facilitates bonding of a device substrate to the CMOS substrate. In embodiments according to the present invention, the final thickness of the deposited layer 202 after the deposition/CMP processes is about 2.3 μm. Alternatively, the height ranges from about 0.5 μm to about 3.0 μm in other embodiments. Of course, the thickness will depend upon the particular applications. As an example, in designs in which air drag is used to dampen motion of the accelerometer elements, the thickness of deposited layer 202 could be decreased to reduce the separation between the various elements of the system. In these implementations, thicknesses less than 1 μm can be utilized.

Moreover, in some embodiments of the present invention, the process used to deposit the layer or layers that form deposited layer 202 is performed in light of the structures present on the CMOS substrate. For example, some CMOS circuitry may be adversely impacted by performing high temperature deposition processes, as these high temperature deposition processes may damage metals or result in diffusion of junctions associated with the CMOS circuitry. Thus, in a particular embodiment of the present invention, low temperature deposition, patterning, and etching processes, such as processes performed at temperatures of less than 500° C., are used to form the layers illustrated in FIGS. 2A-2J. In another specific embodiment, deposition, patterning, and etching processes performed at less than 400° C., are used to form the various illustrated layers.

Figure 2C:
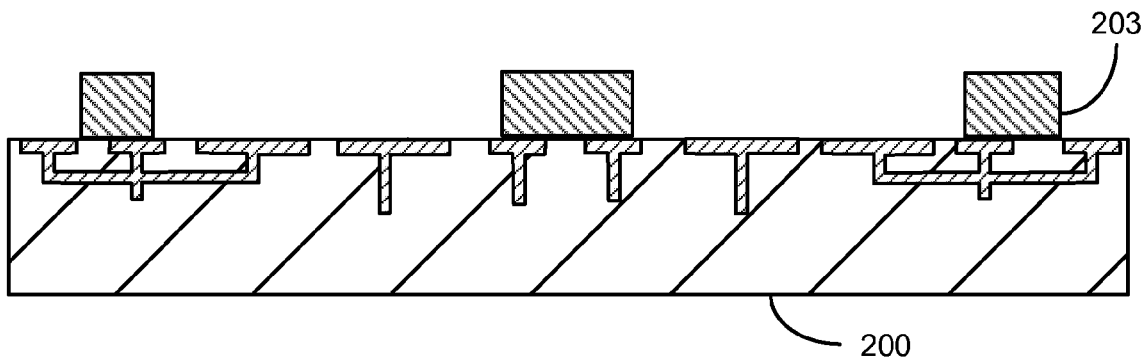

FIG. 2C illustrates substrate 200 and patterned standoff structure 203 after an etch process. For purposes of clarity, a photolithography process in which a photoresist layer is deposited and patterned to form an etch mask on surface 202a of deposited layer 202 is not shown in this process flow. The dimensions of the etch mask may be tightly controlled during photolithography and the etch mask may be formed from any suitable material that is resistant to the etching process used to etch the deposited layer. In a specific embodiment, an etch mask of metal such as Al or TiN is utilized. In other embodiments, a photoresist layer can serve as the etch mask. Although a one dimensional cross section is illustrated in FIG. 2C, it will evident to one of skill in the art that a two-dimensional pattern of the desired geometry is formed in the deposited layer. Thus, the standoff structures 203 are patterned as appropriate to fabrication of the structures illustrated in FIGS. 1A and 1B.

As illustrated in FIG. 2C, portions of the deposited layer 202 have been removed during the etch process, resulting in the formation of patterned standoff structure 203. The lateral dimensions of the standoff structures are a function of the geometry of the etch mask and the etch process.

Embodiments of the present invention in which the standoff structures are fabricated from silicon oxide, silicon nitride, or silicon oxynitride, or combinations thereof, provide benefits based on the electrical properties of the material used during fabrication. For example, these materials, among others, provide a high degree of electrical insulation, electrically isolating the CMOS substrate from one or more elements fabricated in other layers positioned above the standoff structures 203. Other suitable standoff regions materials, such as polysilicon material, including amorphous polysilicon are characterized by electrical properties that provide benefits in alternative embodiments.

As illustrated in FIG. 2C, an anisotropic etch has been used to define the patterned standoff structures 203. The etch profile defines vertical walls for the standoff structures with a predetermined thickness. The etching process is not limited to anisotropic etches, but other etch processes can be utilized including oxide etches, RIE, or the like. The dimensions of the standoff structures are determined, in part, by the functions performed in supporting the stator comb fingers, the anchors, and the like. In the illustration, the lateral thickness of the standoff structures ranges from about 2 μm as a minimum dimension to several millimeters as a maximum dimension. As an example, the stator island supporting the stator comb fingers is about 8 μm in width and 150 μm in length. In other embodiments, the width and length vary between about 2 μm and 2 mm. An etch process that terminates at the upper surface of the CMOS substrate is shown in the embodiment illustrated in FIG. 2C, but this is not required by the present invention. In another embodiment, the etching process is terminated prior to exposure of the electrode layer, enabling the standoff structures to not only provide mechanical support for overlying layers, but additional passivation benefits to the electrodes on the CMOS substrate.

As discussed above, in some embodiments of the present invention, the processes used to deposit, pattern, and etch the layer or layers from which the standoff structures are fabricated are performed at low temperatures. For example, these processing steps may be performed with a view to the structures present on the CMOS substrate prior to the formation of the deposited layer, such as CMOS circuitry. Since some CMOS circuitry may be adversely impacted by performing high temperature deposition processes, which may damage metals coupling CMOS transistors or result in diffusion of junctions associated with the CMOS circuitry, low temperature deposition processes are utilized according to some embodiments of the present invention. Moreover, in a particular embodiment of the present invention, low temperature deposition, patterning, and etching processes, such as processes performed at temperatures of less than 500° C., are used to form the layer or layers from which the standoff structures are fabricated. In another specific embodiment, deposition, patterning, and etching processes performed at less than 400° C., are used to form the layer from which the standoff structures are fabricated. One of ordinary skill in the art would recognize many variations, modifications, and alternatives within the scope of low temperature processes.

Figure 2D:
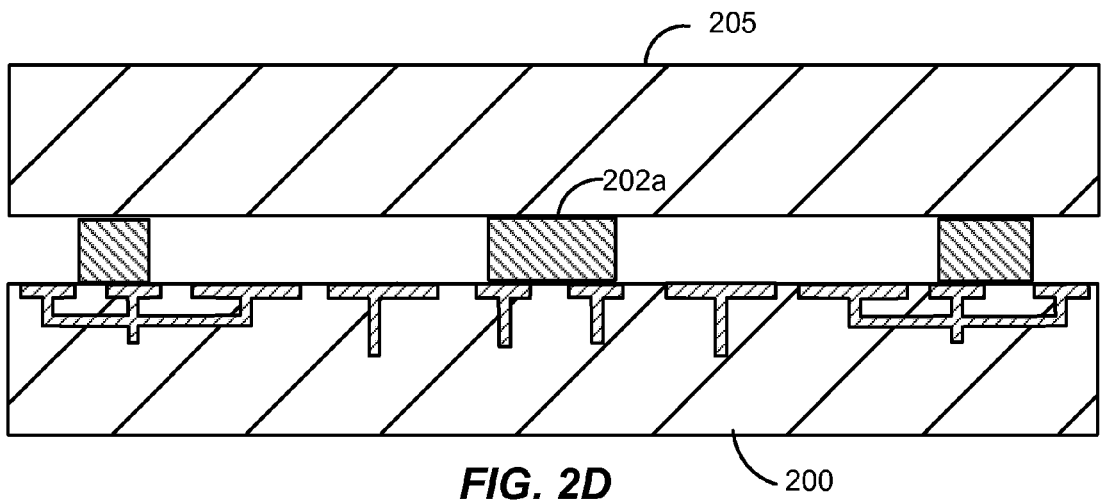

FIG. 2D illustrates the process step of bonding a device substrate 205 to CMOS substrate 200 to form a composite substrate structure. In an embodiment, the device substrate 205 is a silicon wafer between 500 μm and 700 μm in thickness. As illustrated, the etch mask has been removed and the CMOS substrate 200 and the device substrate 205 are bonded together via surface 202a of deposited layer 202 and the bottom surface of the device substrate to form cavities disposed between the standoff structures. Bonding can occur using a variety of techniques. In a specific embodiment, the bonding occurs using a room temperature covalent bonding process. Each of the faces is cleaned and activated, e.g., by plasma activation or by wet processing. The activated surfaces are brought in contact with each other to cause a sticking action. In some bonding processes, mechanical force is provided on each substrate structure to press the faces together. In some embodiments, a post-bonding annealing process is employed to increase final bond strength. In some embodiments, the temperature range for such annealing is between 250° C. to 400° C. Such annealing processes may include batch or single wafer techniques. In embodiments in which the device substrate is silicon and the patterned standoff structures are silicon oxide, silicon bearing bonds are created between the two faces. In alternative embodiments in which a native oxide layer is not present, an oxide layer is formed on the bonding surface of the device substrate prior to bonding to provide an oxide-oxide bond interface. As described above, the upper surface of the deposited layer from which the standoff structures are formed is polished by a CMP process in one embodiment while the bonding surface of the device substrate is polished as well, providing an extremely smooth surface that is conducive to covalent bonding processes. Of course, one of ordinary skill in the art would recognize many other variations, modifications, and alternatives.

Figure 2E:
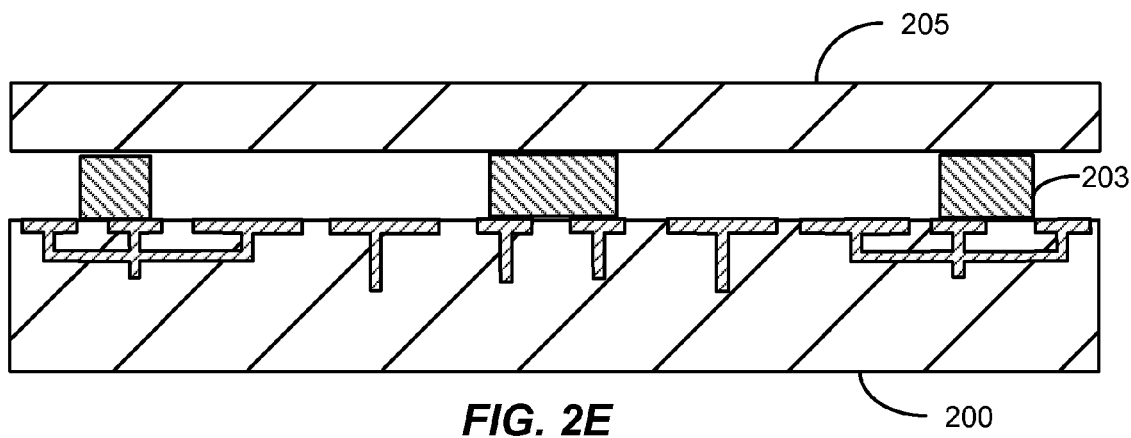
Figure 2F:
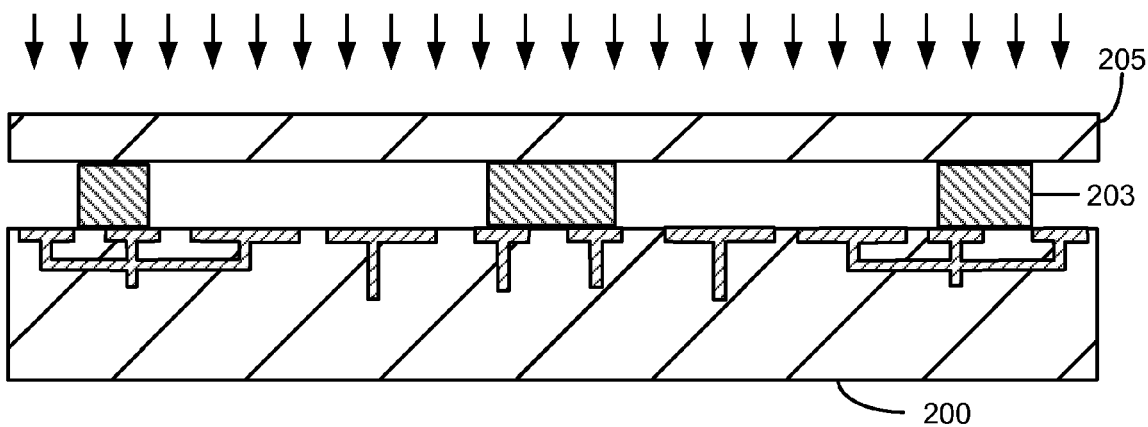

FIG. 2E illustrates the process of thinning the device substrate 205 to a thickness of about 100 μm. As illustrated, after joining of the substrates to form a bonded or composite substrate structure, the top portion of the device substrate is removed using a grinding process, a CMP process, or the like. One of ordinary skill in the art would recognize many variations, modifications, and alternatives. FIG. 2F illustrates the process of further thinning the device substrate to a thickness of about 35 μm. The arrows above the device substrate illustrate an etch process such as an RIE. Other processes can be utilized as well. For example, in a particular embodiment, the device substrate 205 is ion implanted or otherwise doped to form a heavily doped region parallel to the surfaces of the substrate. The heavily doped region, for instance boron doped at levels of about $1 \times 10^{20}/cm^3$, acts as an etch stop layer, enabling chemical etching to be used to thin the substrate as illustrated in FIG. 2F. Compensation doping with atoms larger than the dopant atoms could also be used to reduce strain in the substrate. One of ordinary skill in the art would recognize many variations, modifications, and alternatives.

In embodiments of the present invention, the thickness of the device substrate after the process illustrated in FIG. 2F ranges from about 25 μm to about 50 μm. For some gyroscope applications, the thickness could be considerably less, for example, about 5 μm. In a particular embodiment, a reactive ion etching (RIE) process is used to thin the device substrate to the desired thickness. In other embodiments, other chemical processes, mechanical processes, combinations thereof, or other suitable material removal processes are utilized to reduce the thickness of the device substrate. In some embodiments, to enable accurate alignment of patterned structures formed on the thinned device substrate to patterned structures on the CMOS substrate, techniques of back-side alignment mark formation, front-side alignment mark transfer, or infrared through-wafer alignment mark recognition are employed.

Figure 2G:
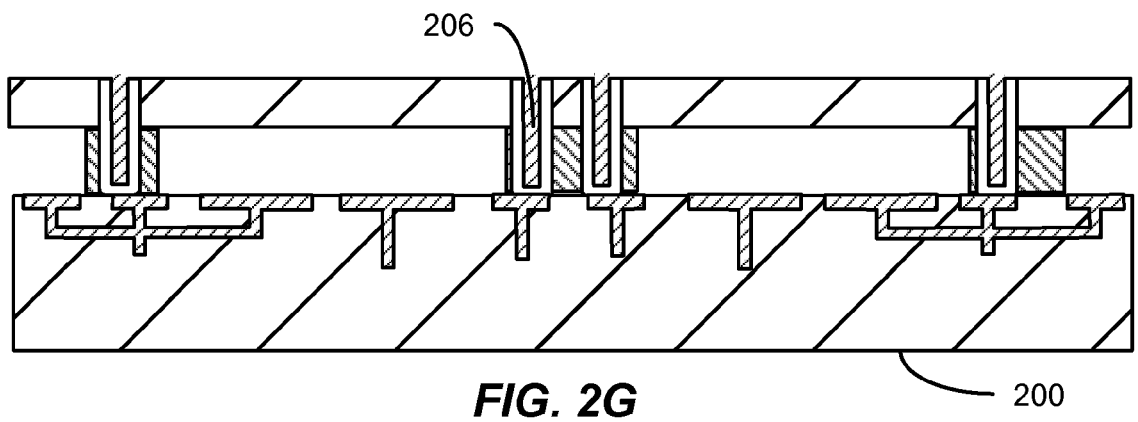

FIG. 2G illustrates the process of forming a plurality of trenches in the device substrate 205 and the standoff structures 203 and then filling at least a portion of the trenches with a conductive material. The plurality of trenches 206 are formed using a via formation process such as patterning and etching. Depending on the particular materials utilized in the device substrate and the standoff structure, one or more etch processes may be used as will be evident to one of skill in the art. After formation of the plurality of trenches, one or more deposition/polishing processes can be utilized to form a conductive element providing electrical connectivity between the electrical components of the CMOS substrate and one or more electrical components formed in the device substrate. The via fill metallization provides for electrical connectivity between the electronics present in the CMOS substrate and the moveable elements in the accelerometer. For example, the change in the capacitance between the moveable comb fingers and the stator comb fingers can be transmitted to the sensing circuitry through the via fill metallization.

In the embodiment illustrated in FIG. 2G, the trenches are filled with a Ti/TiN/W conformal adhesion layer/barrier layer/plug metallization. Etchback or CMP processes are performed to planarize the surface after metal deposition. In other embodiments, electrically active TiN films can be used as via fill metallization. Additional discussion related to via etching and filling is provided more particularly below.

Figure 2H:
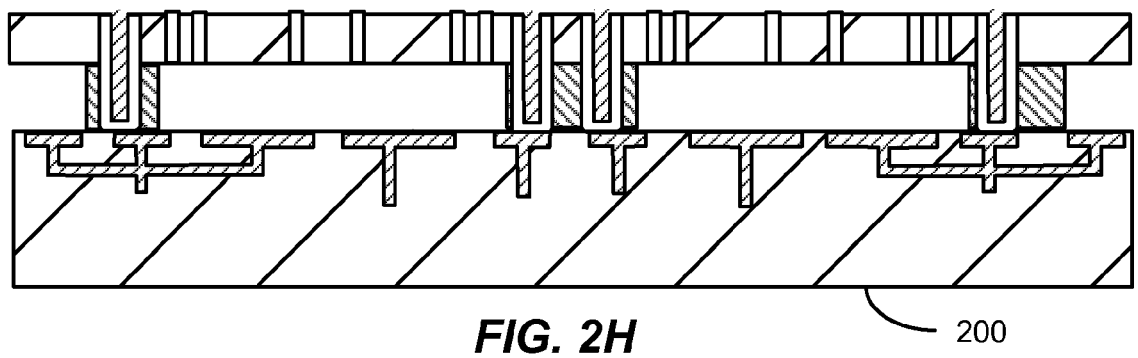

FIG. 2H illustrates the process of patterning and etching of the device substrate to form moveable elements suitable for use in accelerometer and gyroscope applications. In order to form the structure illustrated, for example, in FIG. 1A, the surface of the device substrate is patterned with a two-dimensional pattern and then etched to release the elements of the accelerometer that move with respect to the stator. Examples include the comb fingers 105 that move as illustrated in FIG. 1A. Although only a single dimension of such patterns is illustrated in FIG. 2H, it will be evident to one of skill in the art that two dimensional patterning is included within the scope of the present invention. One or more patterning/etching steps can be used in releasing the moveable elements illustrated in FIG. 2H.

Figure 2I:
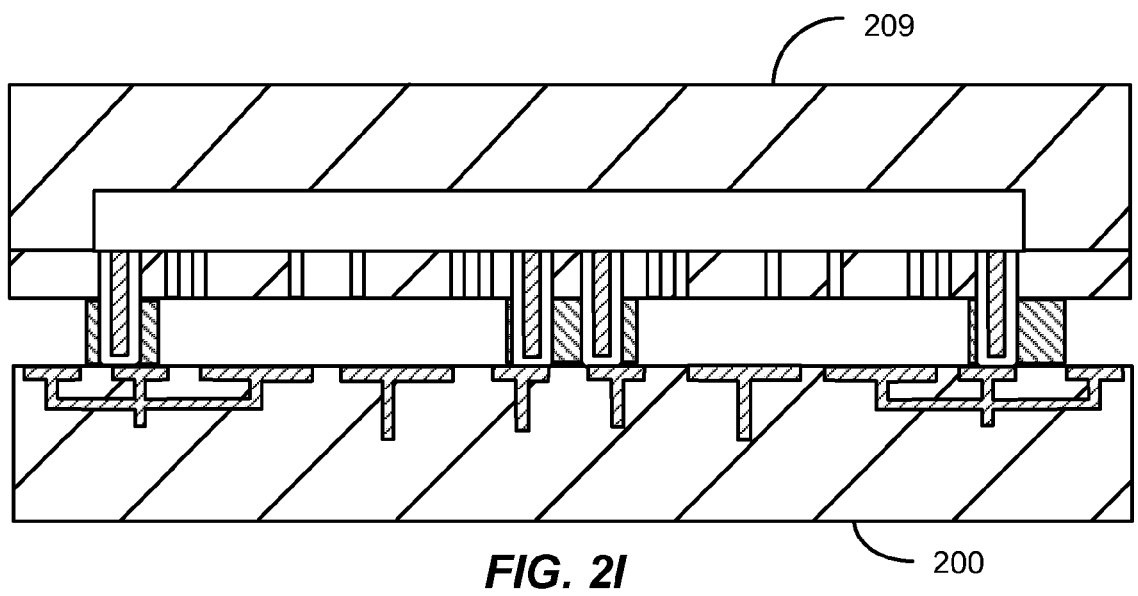

FIG. 2I illustrates bonding of a cap wafer to the combined substrate structure. Cap wafer 209 includes a plurality of recesses formed in one side of the cap wafer. The cap wafer 209, which is typically fabricated from a silicon substrate, can be patterned and etched to form the cavities illustrated in FIG. 2I. In other embodiments, other suitable substrates can be utilized, for example, a glass substrate. In an embodiment, the cavities have a depth that ranges from about 1 μm to about 10 μm in depth, with a particular embodiment having a cavity depth of 5 μm. The vertical dimensions of the cavities are selected to enable the moveable portions of the MEMS devices to move unhindered. At the same time, protrusions may be provided at predetermined locations in order to serve as motion stops for the moveable elements. As an example, for accelerometers that are designed to operate by moving in the horizontal plane in relation to FIG. 2I, motion stops can be provided in the cavity or below the moveable elements to arrest motion in the vertical direction at predetermined locations.

The lateral dimensions of the cavity are selected based on the geometry of the MEMS device covered by the cover wafer. As illustrated in FIG. 2I, generally annular bonding regions are provided at predetermined locations including peripheral portions of the cap wafer that are bonded to an upper portion of the device substrate. Thus, a controlled environment is provided for the MEMS devices fabricated according to embodiments of the present invention. In some embodiments, the controlled environment, which can be provided during the operating lifetime of the accelerometer, can include air, dry air, nitrogen, inert gases, or the like at atmospheric or reduced pressure. In a particular embodiment, a vacuum environment is provided as the controlled environment. In some applications, various pressures of $SF_6$ or other high dielectric constant gases are utilized. One of ordinary skill in the art would recognize many variations, modifications, and alternatives.

Figure 2J:
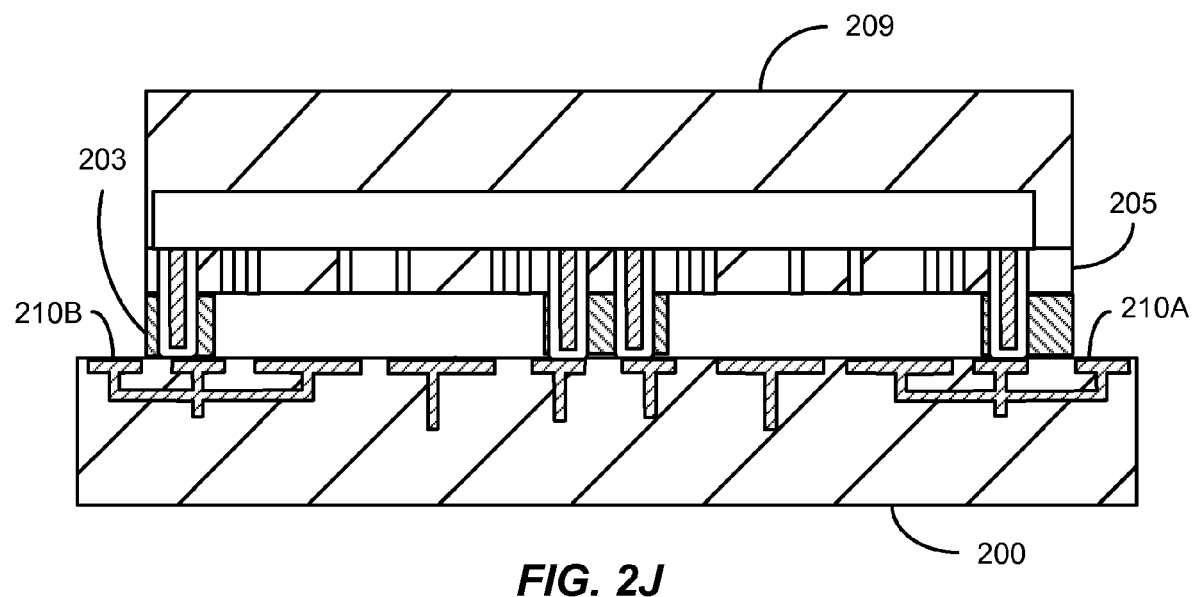

Wafer bonding techniques are utilized to join the cap wafer to the composite substrate structure. As examples, covalent bonding processes, glass frit bonding processes, eutectic bonding processes, and the like can be utilized to join the various substrates. In embodiments in which both the device substrate and the cap wafer are silicon substrates, native oxides formed on the wafer surfaces will provide an oxide-to-oxide bond suitable for many applications. Additional description related to substrate bonding techniques is provided in commonly owned U.S. Pat. No. 7,585,747, the disclosure of which is hereby incorporated by reference. FIG. 2J illustrates dicing and singulation of the substrates illustrated in FIG. 2I into a single device package.

In the embodiment illustrated in FIG. 2J, one or more accelerometers are provided in a controlled environment package that is an integrated package including drive/sensing electronics present in the CMOS substrate. Thus, an integrated device utilizing a 3D architecture is formed in which the electronics and matching mechanical structures are monolithically integrated with a reduced-size footprint. Multiple dies are formed using these processes, increasing manufacturing yield in some embodiments. Electrode structures 210A/B are provided at the lateral edges of the CMOS substrate, enabling integration with other system components external to the packaged device. As illustrated in FIG. 2J, bond pads 210A and 210B are provided to form connections to external control/drive/sense circuits. Referring to FIGS. 1A and 1B, it will be understood that multiple accelerometers can be included within a single controlled environment illustrated in FIG. 2J. Thus, in referring to a single device package, the single device could be a three-dimension accelerometer, measuring acceleration in the x-, y-, and z-dimensions. Two lateral accelerometers (x- and y-directions) as illustrated in FIG. 1A could be integrated with a vertical accelerometer (z-direction) as illustrated in FIG. 1B.

Figure 3A:
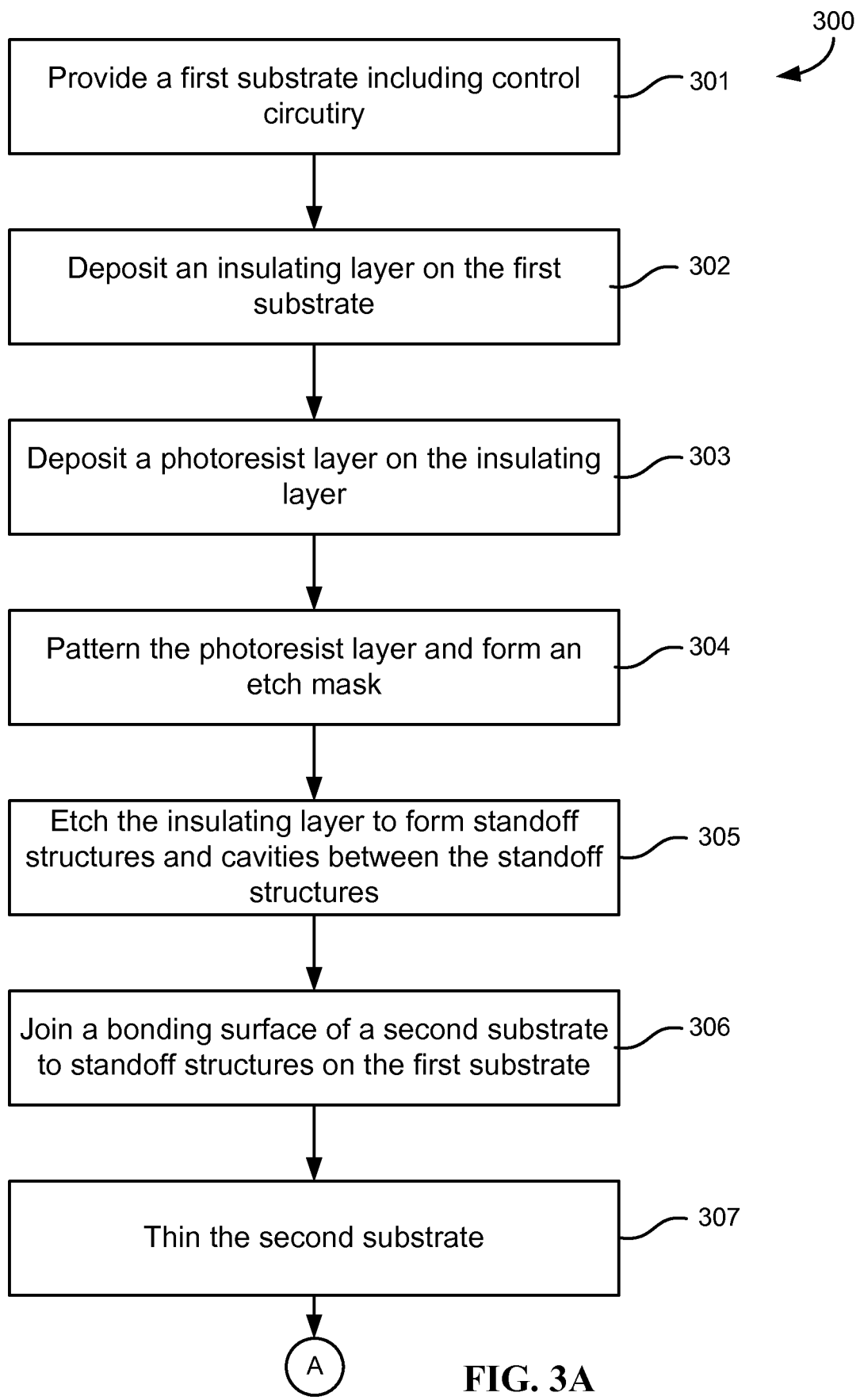
FIGS. 3A and 3B illustrate a flow diagram of a process for fabricating the MEMS device of FIGS. 2A-2J according to an embodiment of the present invention.
Figure 3B:
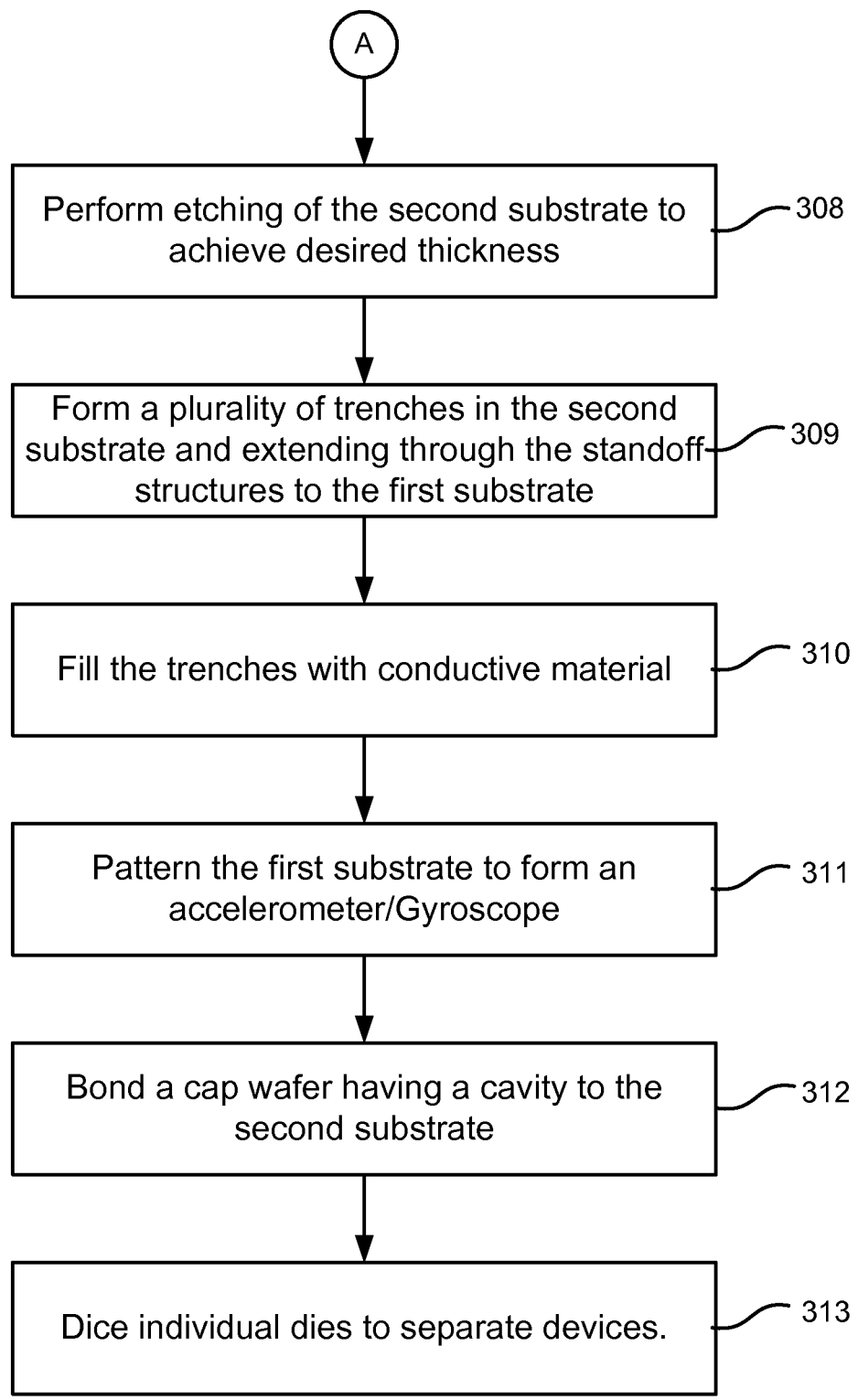

FIGS. 3A and 3B illustrate a flow diagram of a process for fabricating the MEMS device of FIGS. 2A-2J according to an embodiment of the present invention. As illustrated in FIG. 3A, the method includes providing a first substrate including control circuitry (301). The first substrate, which is also referred to as the CMOS substrate, has a top surface and a bottom surface. The method also includes forming an insulating layer over the top surface of the first substrate (302).

The insulating layer, which is used in the process of forming the standoff structures is typically blanket deposited and then smoothed using a CMP or other suitable polishing process in a single step or multi-step deposition process.

The method also includes depositing a photoresist layer (303) and patterning the photoresist layer to form an etch mask (304). The method further includes removing a first portion of the insulating layer to form a plurality of standoff structures (305). The standoff structures are disposed in a plane, thereby forming one or more cavities between adjacent standoff structures.

The method includes bonding a second substrate to the first substrate (306). The second substrate has an upper surface and a lower surface and may be a silicon substrate, an SOI substrate, a substrate doped to provide an etch stop layer, or the like. Depending upon the implementation, one of several bonding techniques can be utilized including covalent bonding, glass frit bonding, eutectic bonding, or other suitable wafer bonding techniques. The second substrate is thinned to a predetermined thickness, typically using a CMP process (307) and an etching process such as RIE (308). The method also includes forming a plurality of trenches in the second substrate (309). Each of the plurality of trenches extends to the top surface of the first substrate, for example, from the upper surface of the second substrate to the top surface of the first substrate. At least a portion of each of the plurality of trenches is filled with a conductive material (310) such as Ti/TiN/W or other suitable via fill metallization. The MEMS device elements are formed in the second substrate, for example accelerometer or gyroscope elements (311). A third substrate (e.g., a cap wafer) is bonded to the second substrate to form a controlled environment (312). Depending upon the implementation, one of several bonding techniques can be utilized including covalent bonding, glass frit bonding, eutectic bonding, or other suitable wafer bonding techniques. After wafer bonding, individual dies are diced and singulated to form separate devices (313). Each separate device can include several accelerometers or gyroscopes.

It should be appreciated that the specific steps illustrated in FIGS. 3A and 3B provide a particular method of fabricating an MEMS device according to an embodiment of the present invention. Other sequences of steps may also be performed according to alternative embodiments. For example, alternative embodiments of the present invention may perform the steps outlined above in a different order. Moreover, the individual steps illustrated in FIGS. 3A and 3B may include multiple sub-steps that may be performed in various sequences as appropriate to the individual step. Furthermore, additional steps may be added or removed depending on the particular applications. In particular, several steps may be omitted in some embodiments. One of ordinary skill in the art would recognize many variations, modifications, and alternatives.

The first substrate may be a CMOS substrate fabricated separately from the other processes steps discussed herein.

It should be noted that embodiments of the present invention do not utilize sacrificial layers that are removed after subsequent layers are deposited or bonded. As a result, there is no need to provide for additional gas vent holes that are used to remove reaction byproducts in designs using sacrificial layers. As an example, in some sacrificial layer designs, a support layer is formed, a subsequent layer is deposited or bonded, and then a portion or all of the support layer is removed, for example, to enable the subsequent layer to be free to move. In order to remove the sacrificial layer, gas vent holes are formed in the subsequent layer in order to enable the reaction byproducts to escape from the structure. In some implementations, holes are made in the proof mass to form the gas vent holes. As a result, the weight of the proof mass is reduced, adversely impacting device performance.

According to embodiments of the present invention, the proof mass does not have holes associated with reaction byproduct evacuation. On the contrary, portions of the proof mass other than the regions associated with the comb fingers are continuous, thereby increasing the weight of the proof mass. In an embodiment, no holes in the proof mass less than 100 $\mu m^2$ in area are utilized since the only holes in the proof mass are used for the comb fingers used for sensing or for attachment of the springs leading to the anchor points. In other embodiments, no holes in the proof mass less than 50 $\mu m^2$, less than 40 $\mu m^2$, less than 30 $\mu m^2$, less than 20 $\mu m^2$, or less than 10 $\mu m^2$ are utilized.

FIGS. 4A-4I show cross-sectional views of a micro electromechanical (MEMS) device during the fabrication process according to a second embodiment of the present invention. In the description that follows, processes that share one or more similarities with the processes discussed in relation to FIGS. 2A-2J are utilized. Accordingly, for similar processes, the description will be limited in the interest of brevity.

Figure 4A:
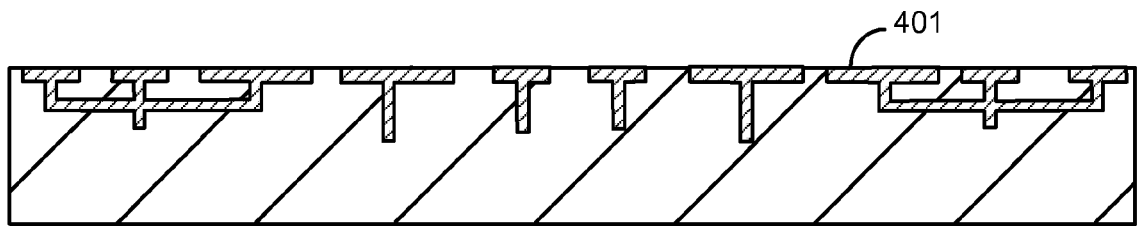
FIGS. 4A-4I show cross-sectional views of a micro electromechanical (MEMS) device during the fabrication process according to a second embodiment of the present invention.
Figure 4B:
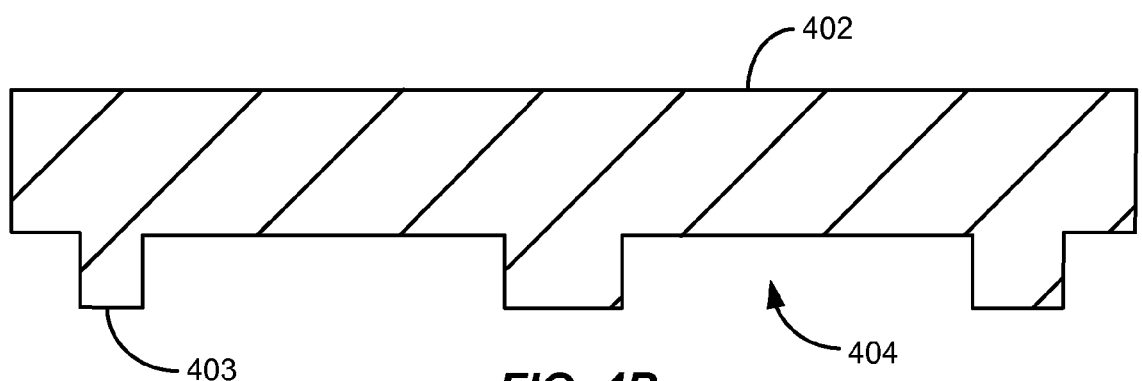
Figure 4C:
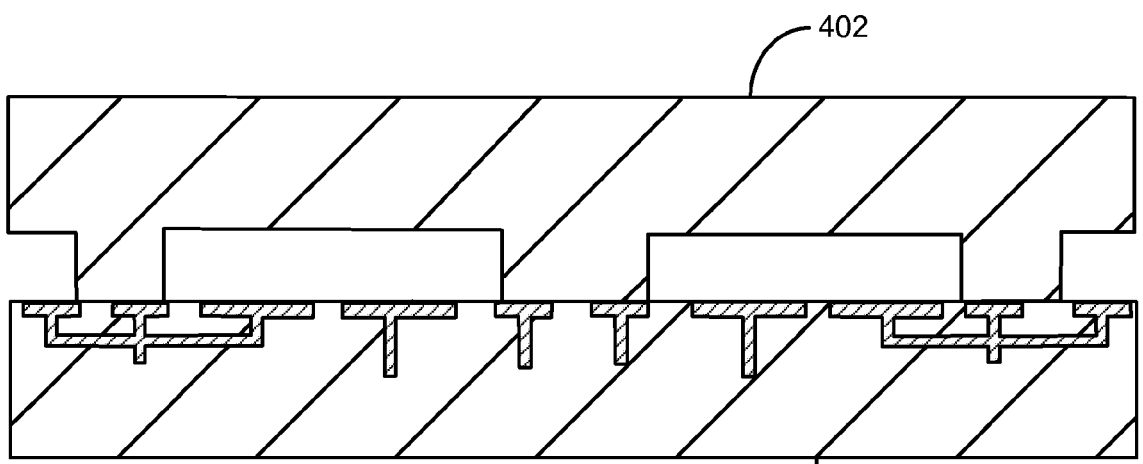

In FIG. 4A, a CMOS substrate 400 including electrodes 401 is provided. The device substrate 402 is processed to form patterned standoff structures 403 and cavities 404 as illustrated in FIG. 4B. Although the cavities are illustrated as separating the standoff structures, in other cross-sections, the standoff structures extend for a larger distance in the plane of the figure. The CMOS substrate 400 and the device substrate 402 are joined to form a composite substrate structure as illustrated in FIG. 4C. In comparison with other embodiments, the standoff structures are formed by processing the device substrate. The fabrication of cavities 404 enables MEMS devices to be fabricated in which the thickness of the device substrate varies as a function of lateral position. As a result, springs with a different thickness than the comb fingers can be fabricated, providing different spring constants and element flexibility. The fabrication of such cavities of varying depth in the lower portions of the device substrate provide for manufacturing capabilities not available using other processing techniques.

Figure 4D:
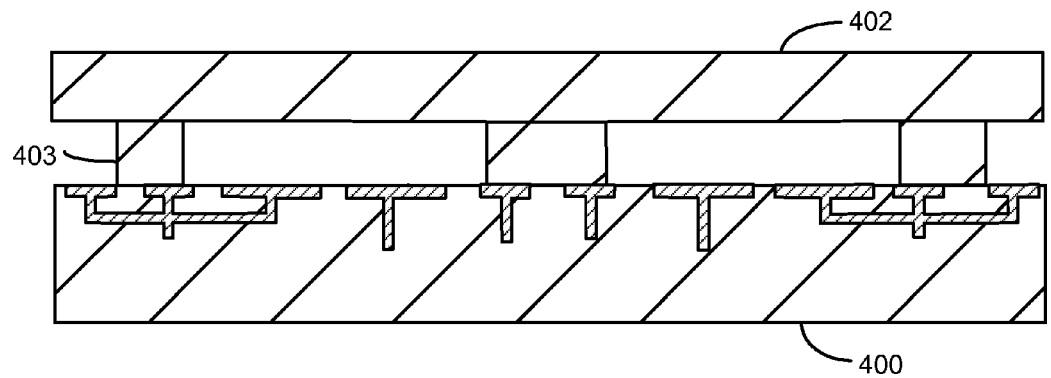
Figure 4E:
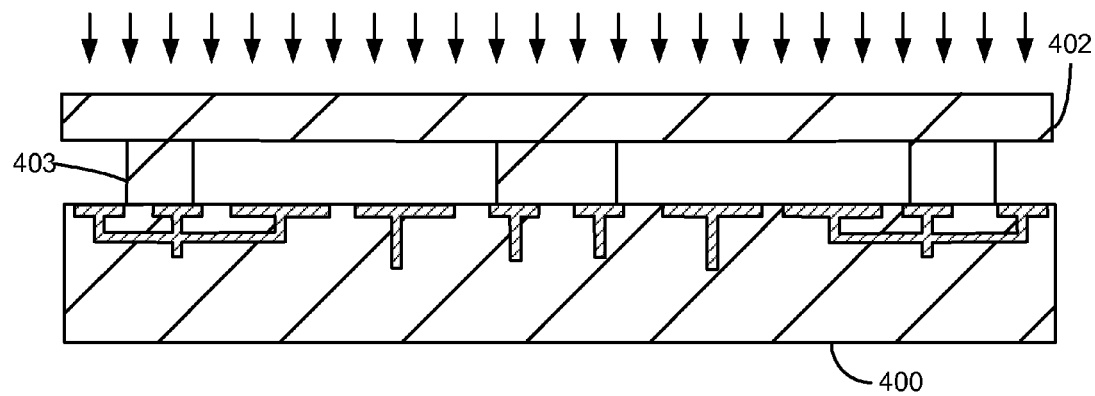
Figure 4F:
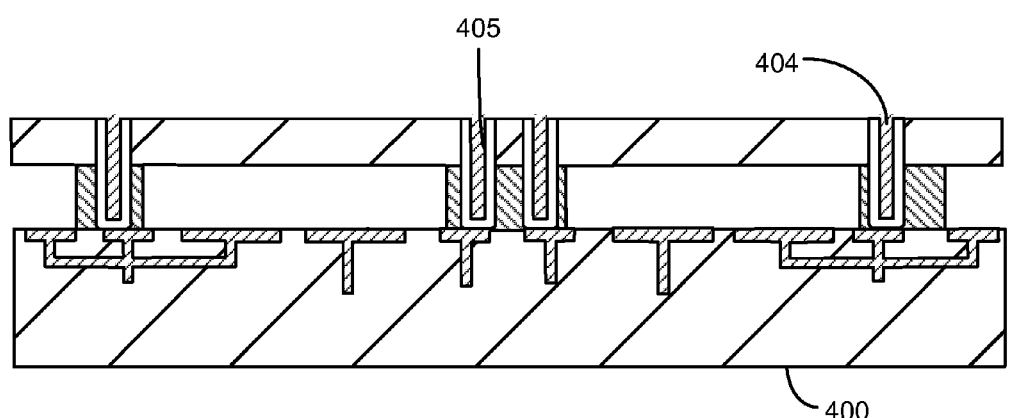
Figure 4G:
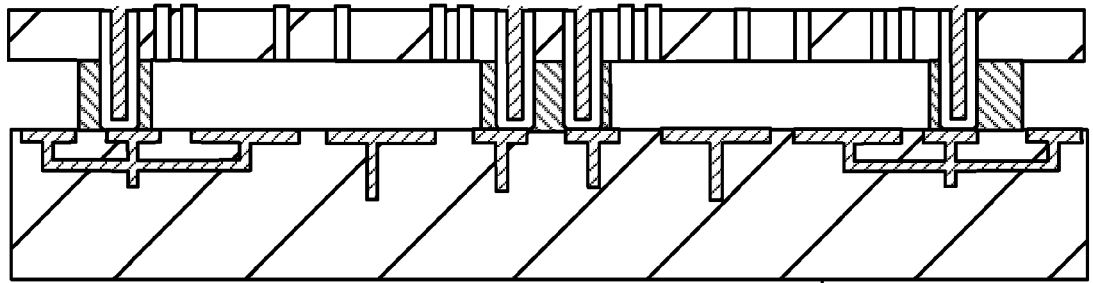
Figure 4H:
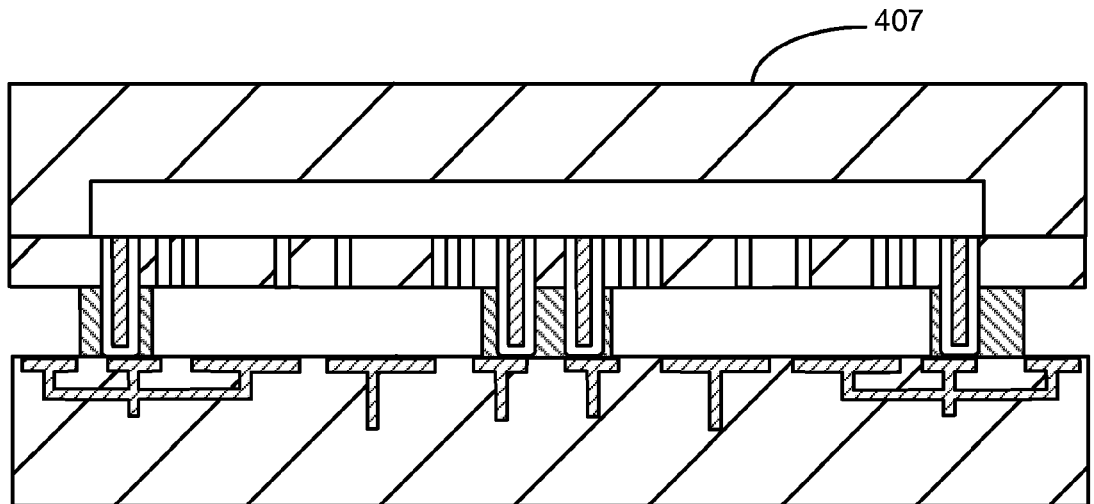
Figure 4I:
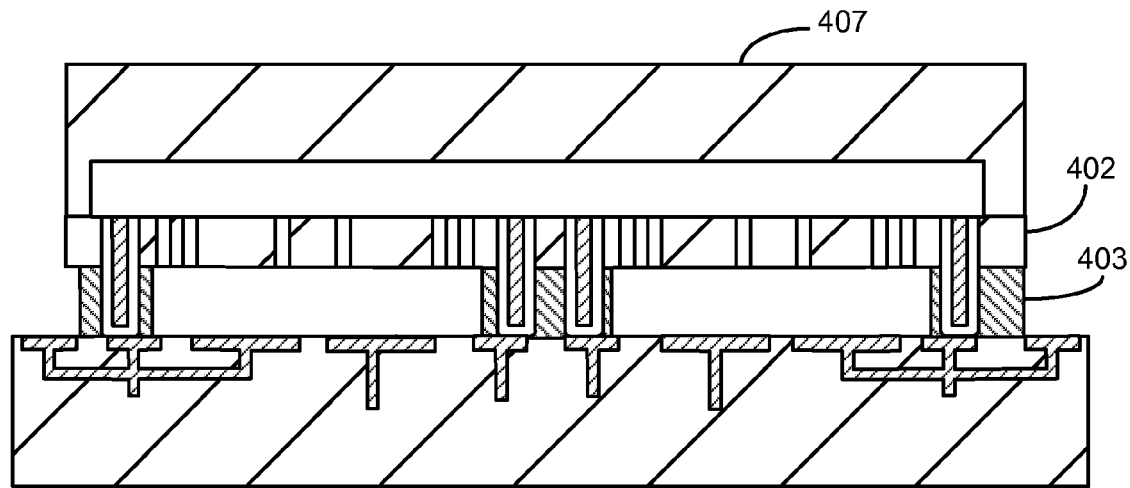

After wafer bonding, the device substrate is initially thinned as illustrated in FIG. 4D and additionally thinned as illustrated in FIG. 4E. Although these thinning processes are illustrated as separate steps in FIGS. 4D (CMP) and 4E (RIE), they could be combined into a single thinning process in other embodiments. The vias 404 are opened and filled as illustrated in FIG. 4F, providing for electrical connectivity between the electrodes 401 and the MEMS elements that will subsequently be formed in the device substrate as illustrated in FIG. 4G. The cap wafer 407 is bonded to the composite substrate structure as illustrated in FIG. 4H and the dies are diced and singulated as illustrated in FIG. 4I.

Figure 5A:
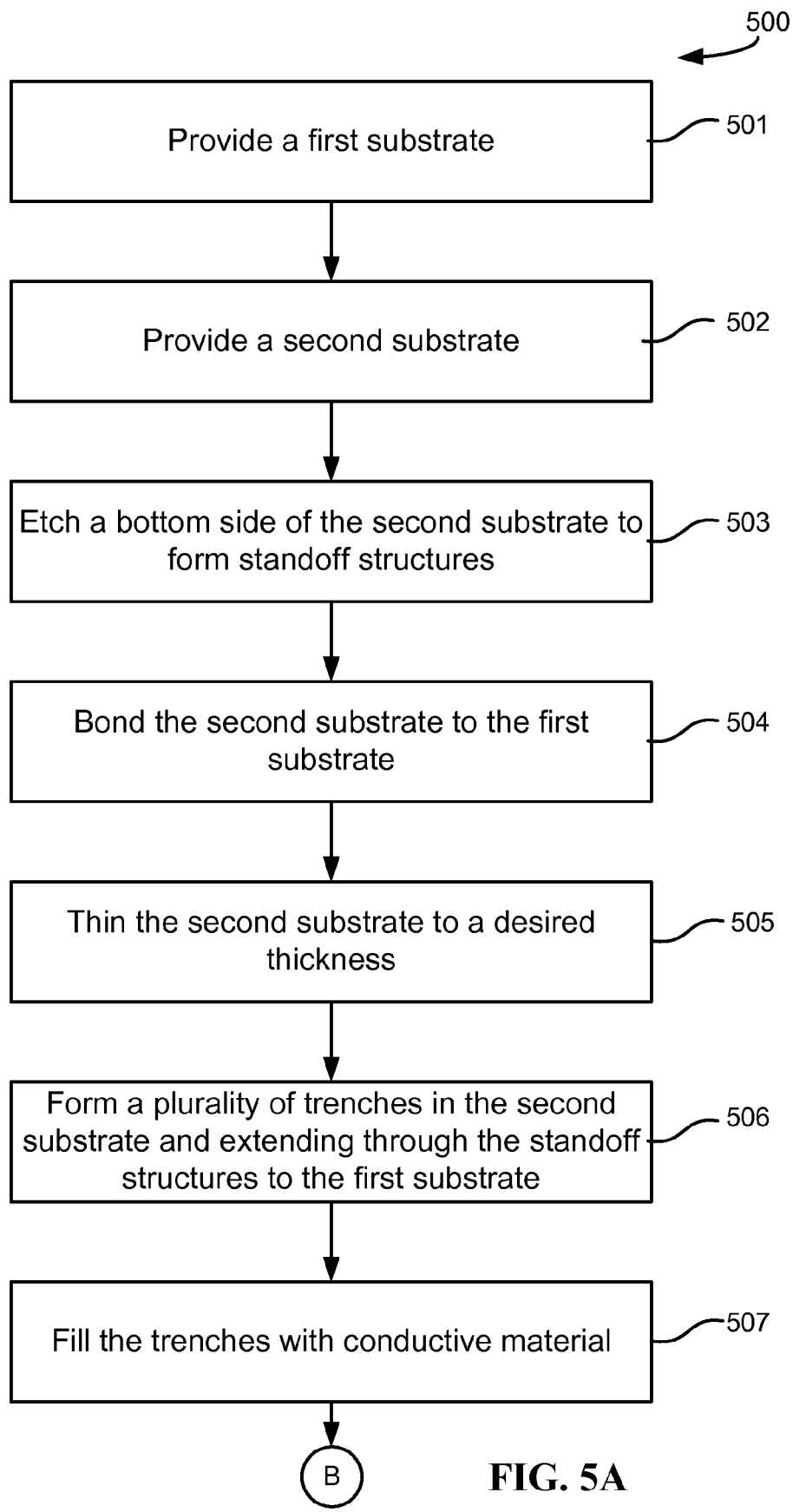
FIGS. 5A and 5B illustrate a flow diagram of a process for fabricating the MEMS device of FIGS. 4A-4I according to an embodiment of the present invention.
Figure 5B:
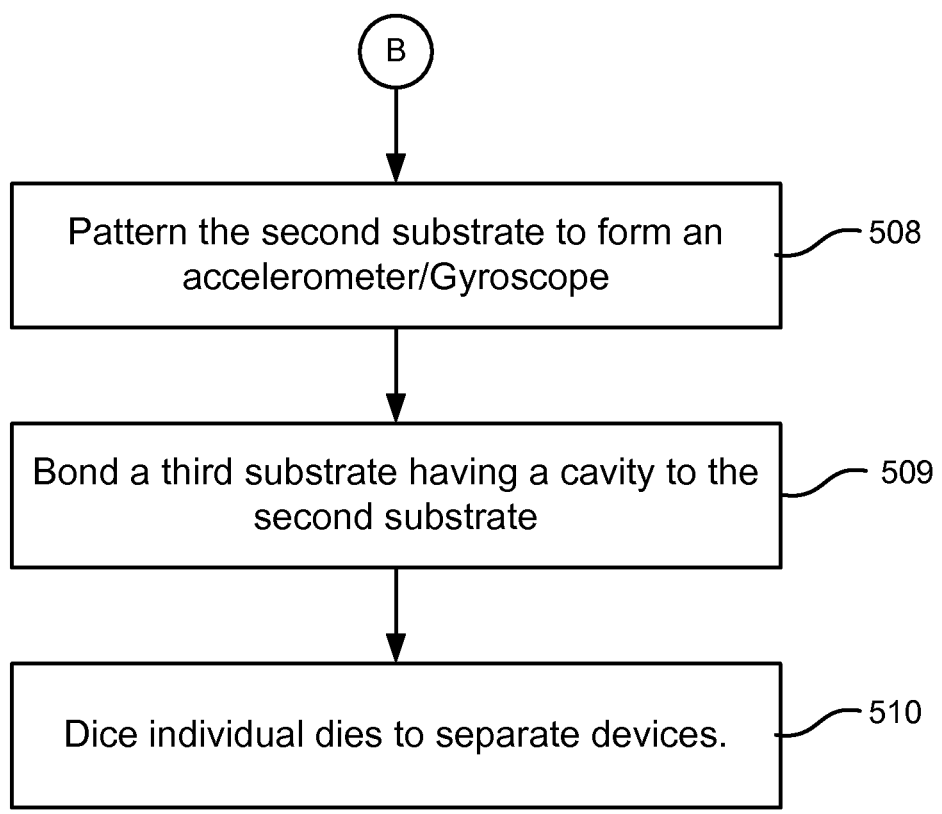

FIGS. 5A and 5B show a flow diagram of a process 500 for a method for fabricating a micro-electromechanical device of FIGS. 4A-4I, according to an embodiment of the present invention. Process 500 includes providing a first substrate including control circuitry, the first substrate having a first surface and an opposing second surface (501). In some embodiments, the first substrate is a CMOS substrate. The method further includes providing a second substrate having a top surface and a bottom surface (502) and removing a portion of the second substrate along the bottom surface to form a plurality of standoff structures (503). In some embodiments, the second substrate is a single crystal silicon substrate. In other embodiments, the second substrate can be a silicon-on-insulator (SOI) substrate with a portion of a silicon layer of the SOI substrate removed to form the cavities. The second substrate is then bonded to the first substrate such that the first surface of the first substrate is in contact with the standoff structures of the second substrate (504). The second substrate is then thinned to a predetermined thickness (505). In some embodiments, the thinning is done by removing a portion of the second substrate along the top surface of the second substrate, e.g., using a chemical mechanical polishing technique. After the thinning, a plurality of trenches are formed in the second substrate (506). In some embodiments, the plurality of trenches extend from the top surface of the second substrate to the first surface of the first substrate. The plurality of trenches are filled with a conductive material (509), e.g., Ti/TiN/W. Subsequently, a portion of one or more micro electromechanical devices is formed in the second substrate (508).

In some embodiments, a third substrate is bonded to the second substrate to enclose the micro-electromechanical device in a cavity formed in the third substrate (509). In some embodiments, the third substrate includes glass and is bonded to the second substrate using glass frit bonding or covalent bonding techniques.

It should be appreciated that the specific steps illustrated in FIGS. 5A and 5B provide a particular method of fabricating an MEMS device according to an embodiment of the present invention. Other sequences of steps may also be performed according to alternative embodiments. For example, alternative embodiments of the present invention may perform the steps outlined above in a different order. Moreover, the individual steps illustrated in FIGS. 5A and 5B may include multiple sub-steps that may be performed in various sequences as appropriate to the individual step. Furthermore, additional steps may be added or removed depending on the particular applications. In particular, several steps may be omitted in some embodiments. One of ordinary skill in the art would recognize many variations, modifications, and alternatives.

Figure 6A:
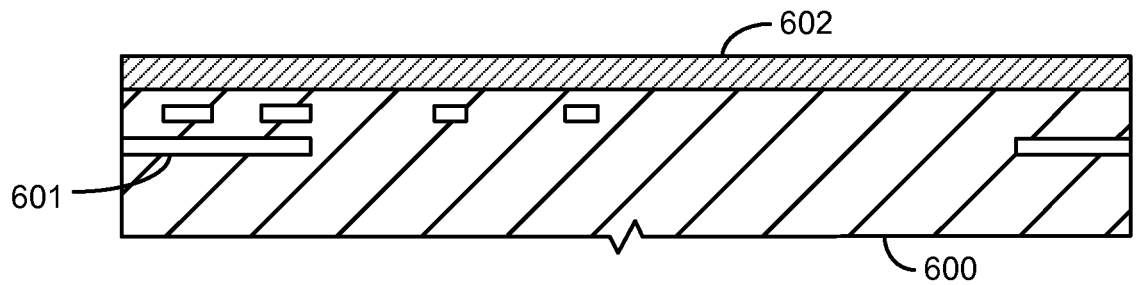
FIGS. 6A-6T show cross-sectional views of a micro electromechanical (MEMS) device during the fabrication process according to a third embodiment of the present invention.
Figure 6B:
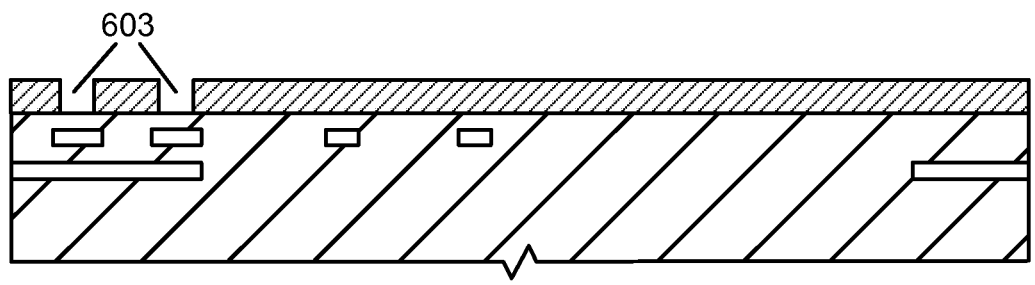
Figure 6C:
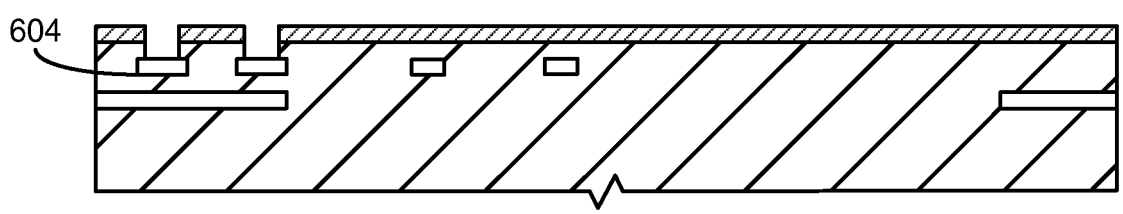
Figure 6D:
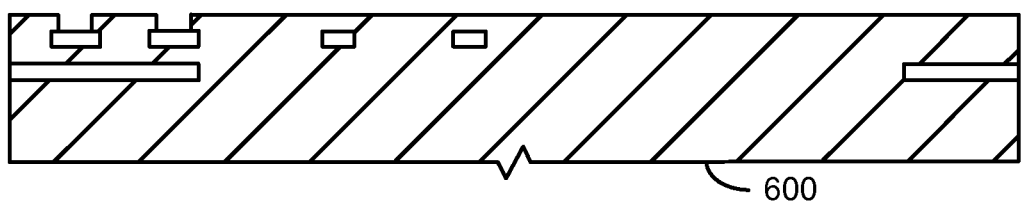
Figure 6E:
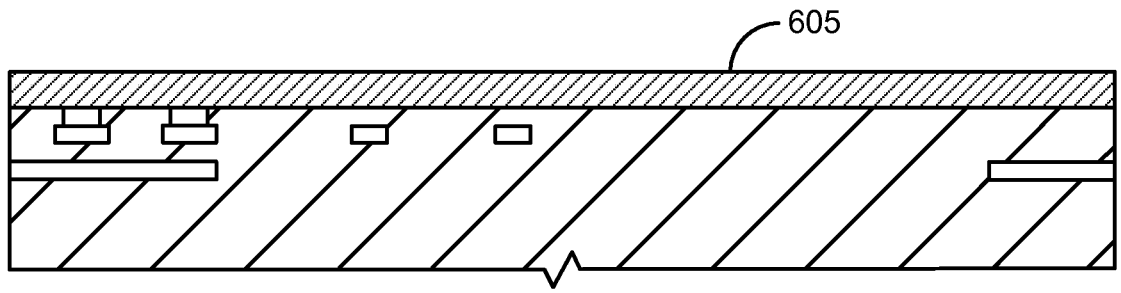
Figure 6F:
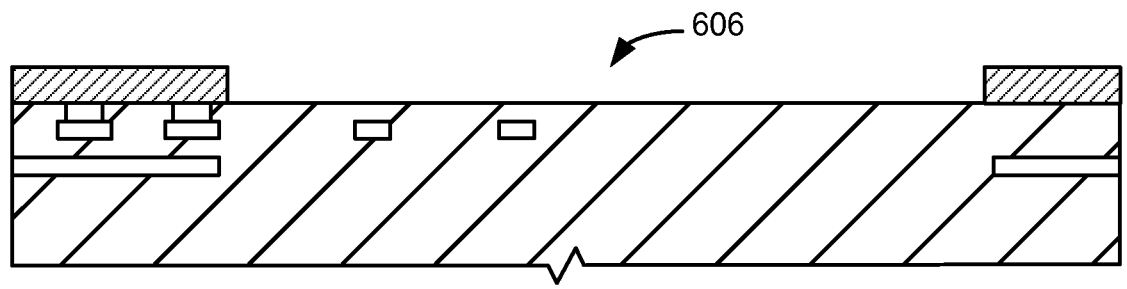
Figure 6G:
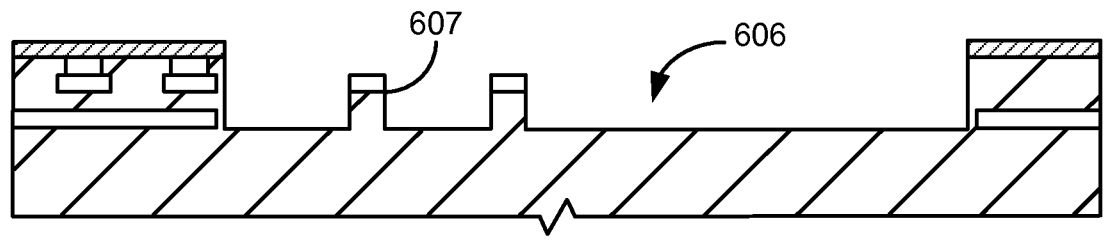
Figure 6H:
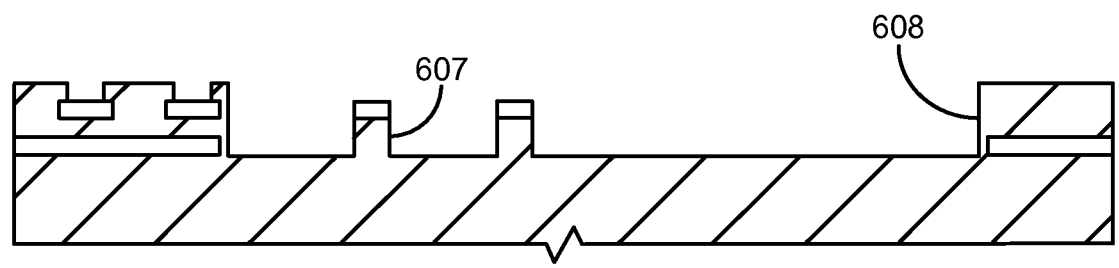
Figure 6I:
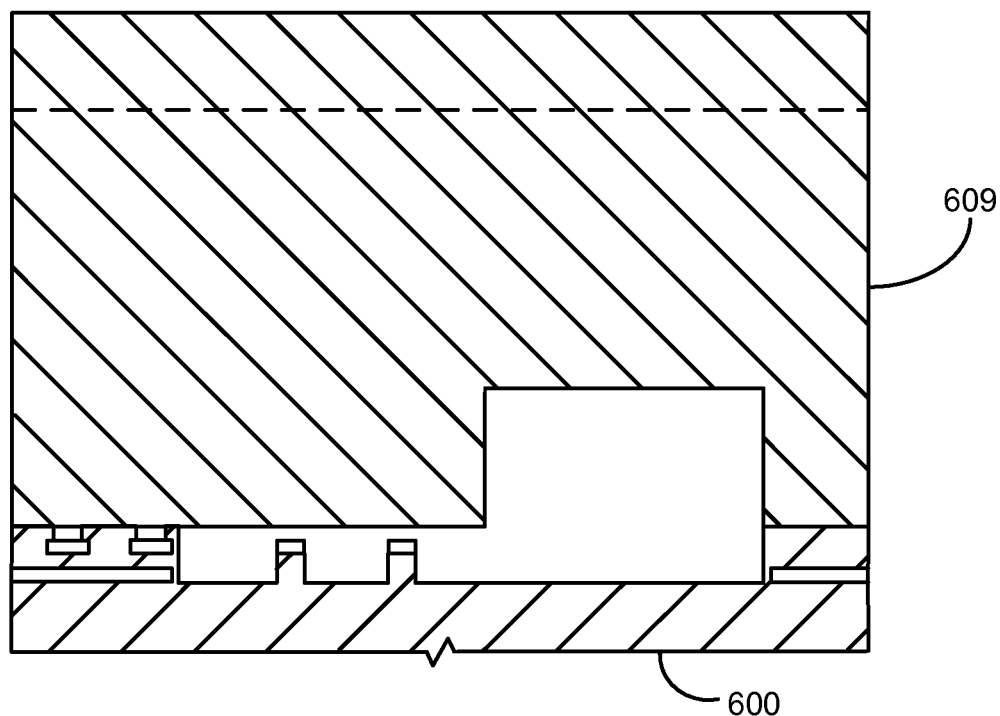
Figure 6J:
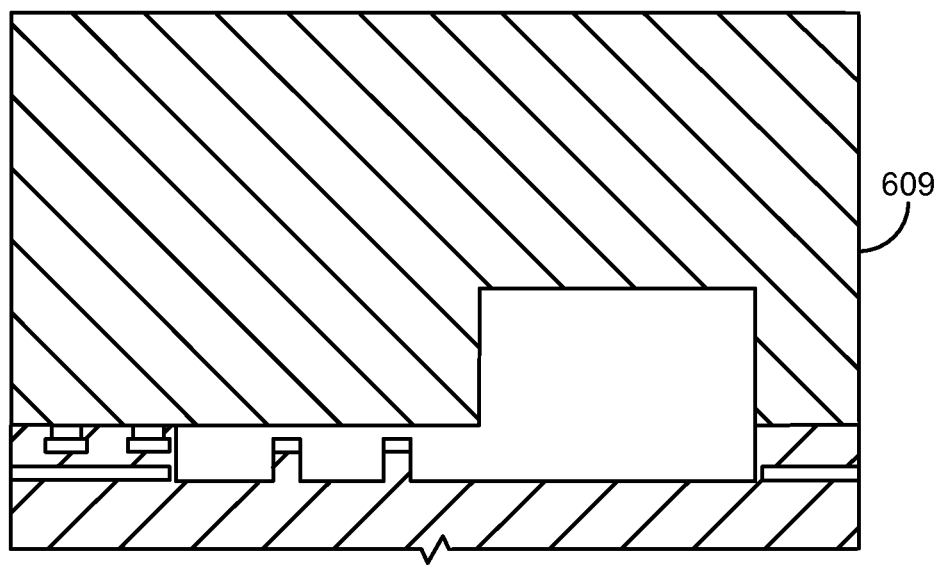
Figure 6K:
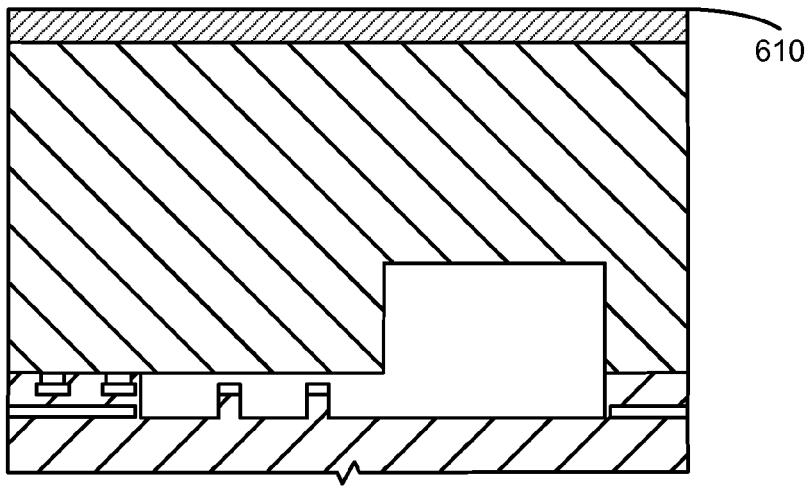
Figure 6L:
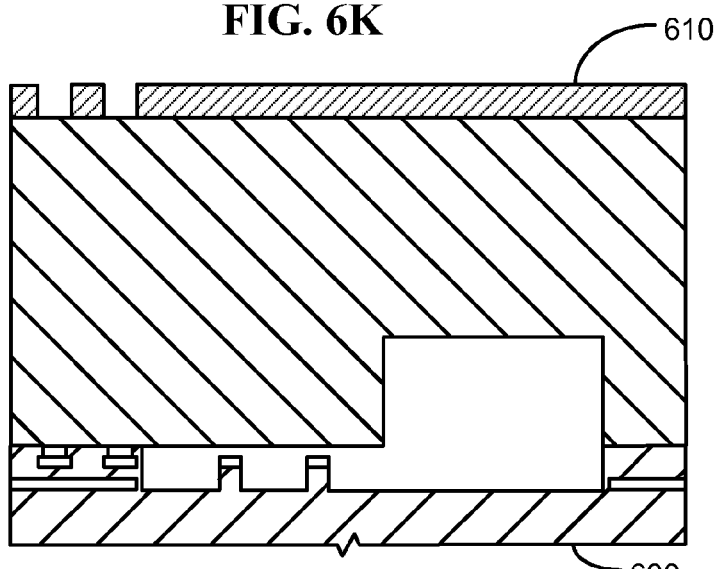
Figure 6M:
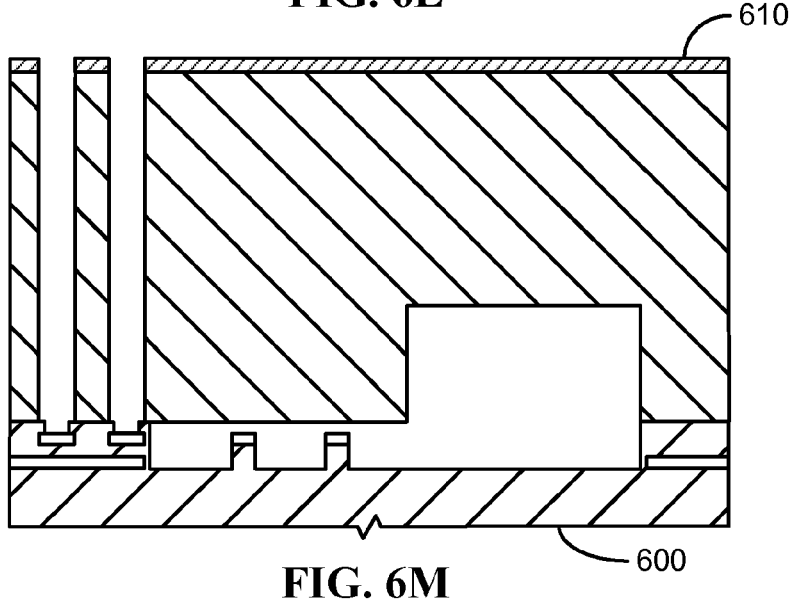
Figure 6N:
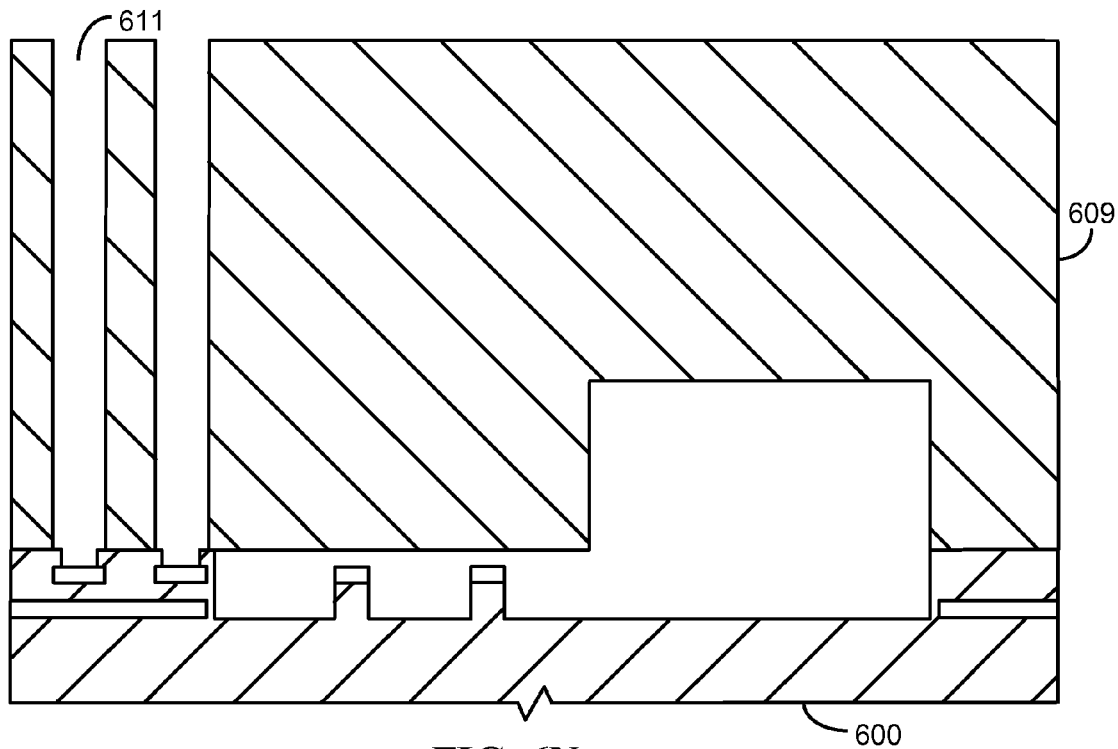
Figure 6O:
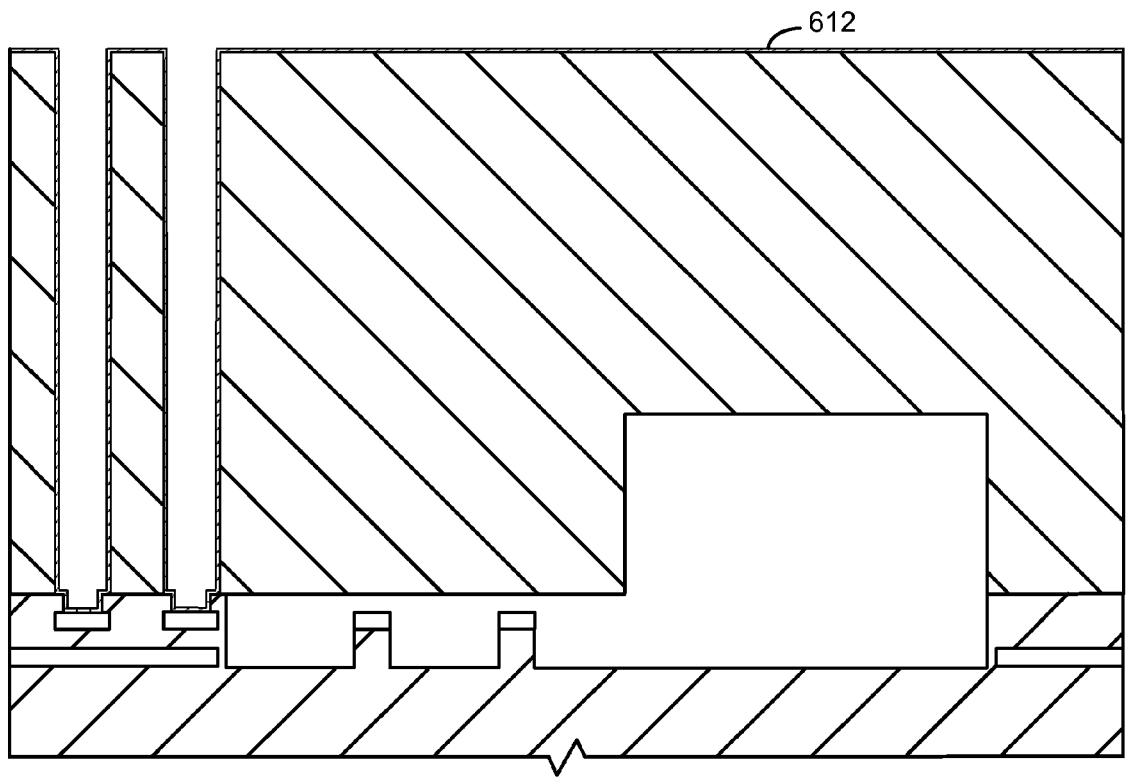
Figure 6P:
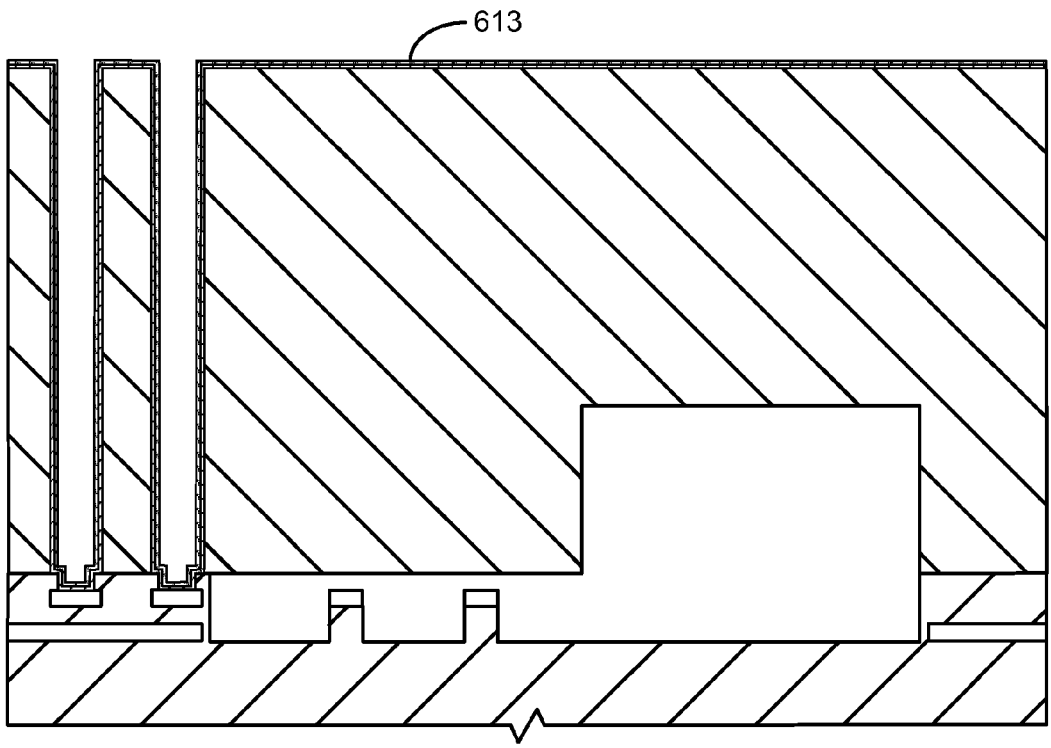
Figure 6Q:
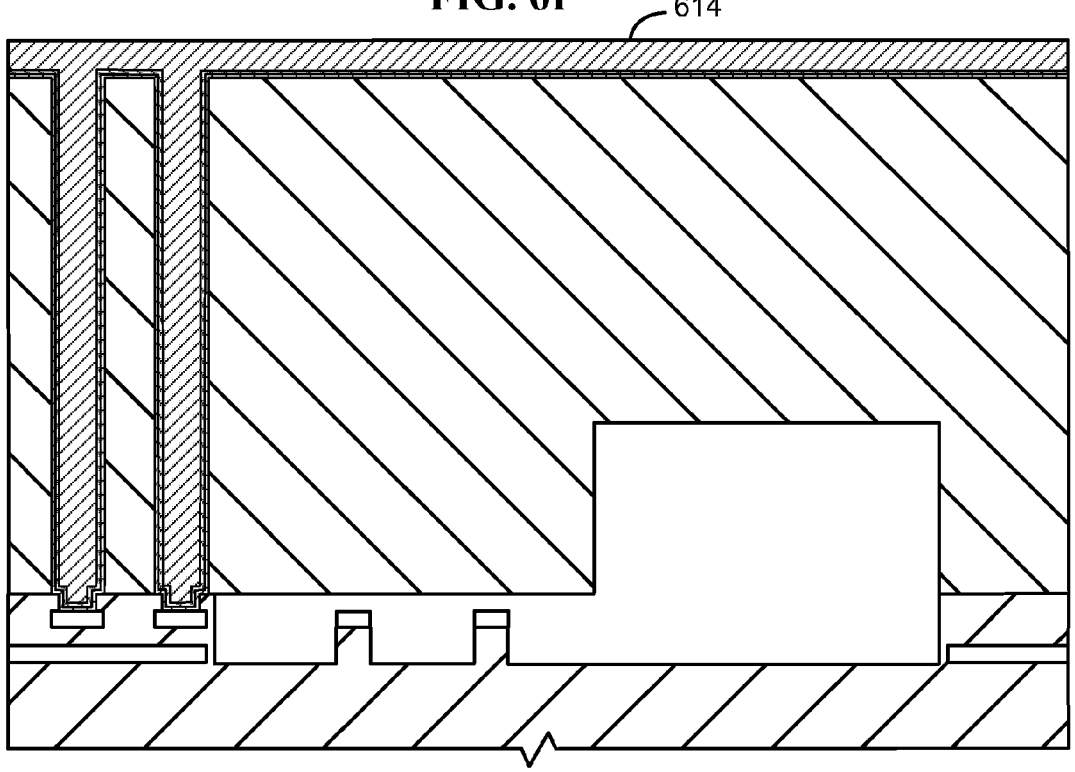
Figure 6R:
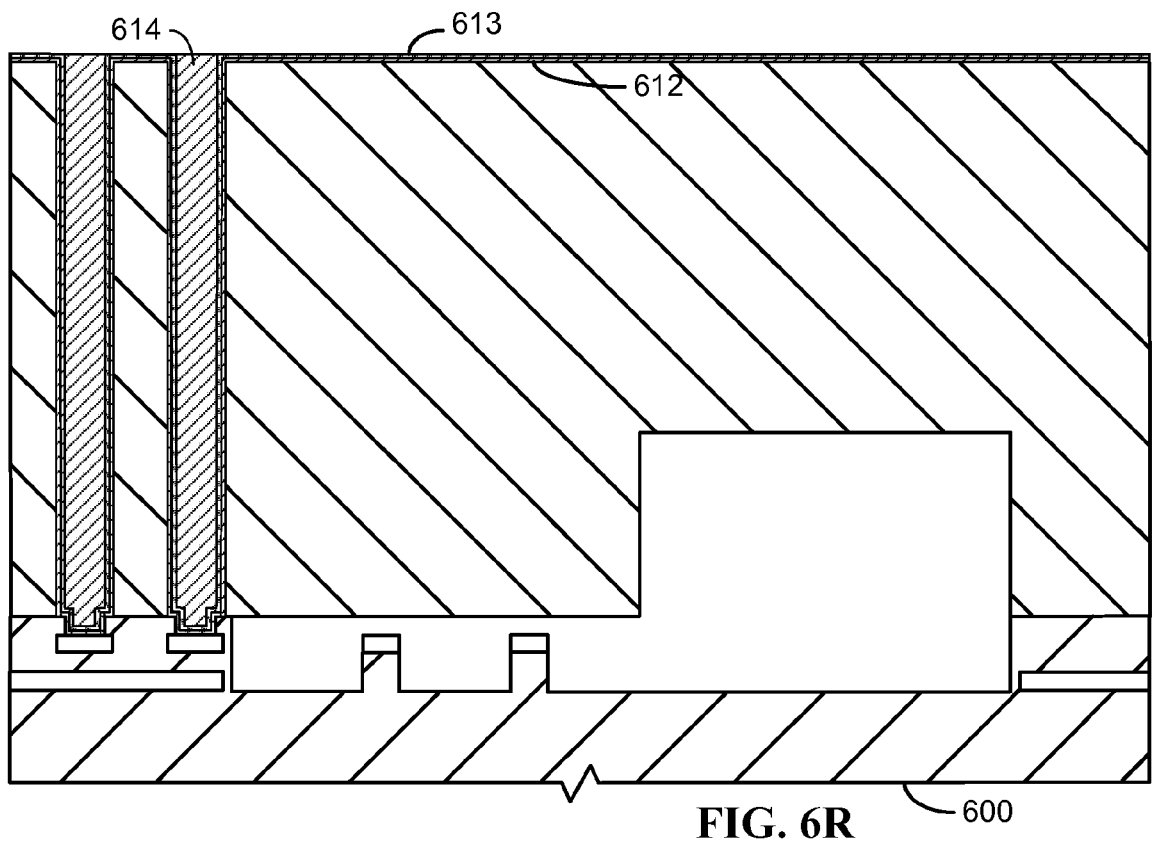
Figure 6S:
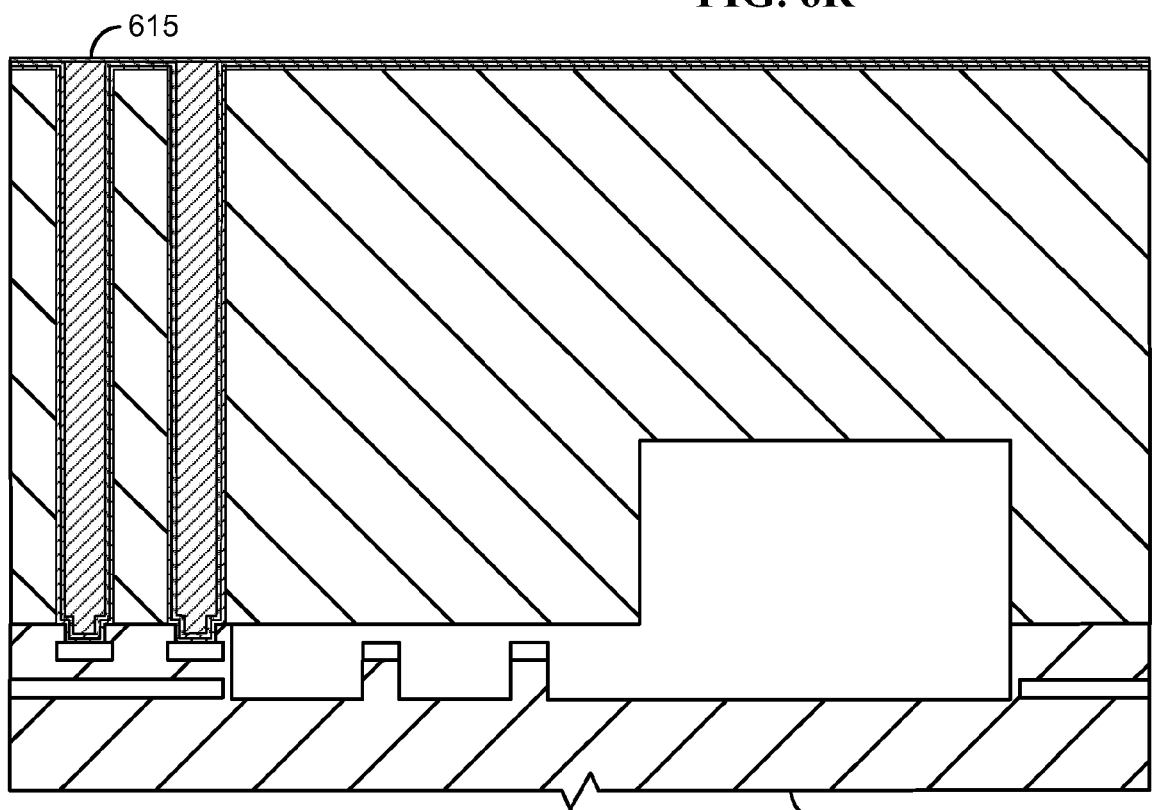
Figure 6T:
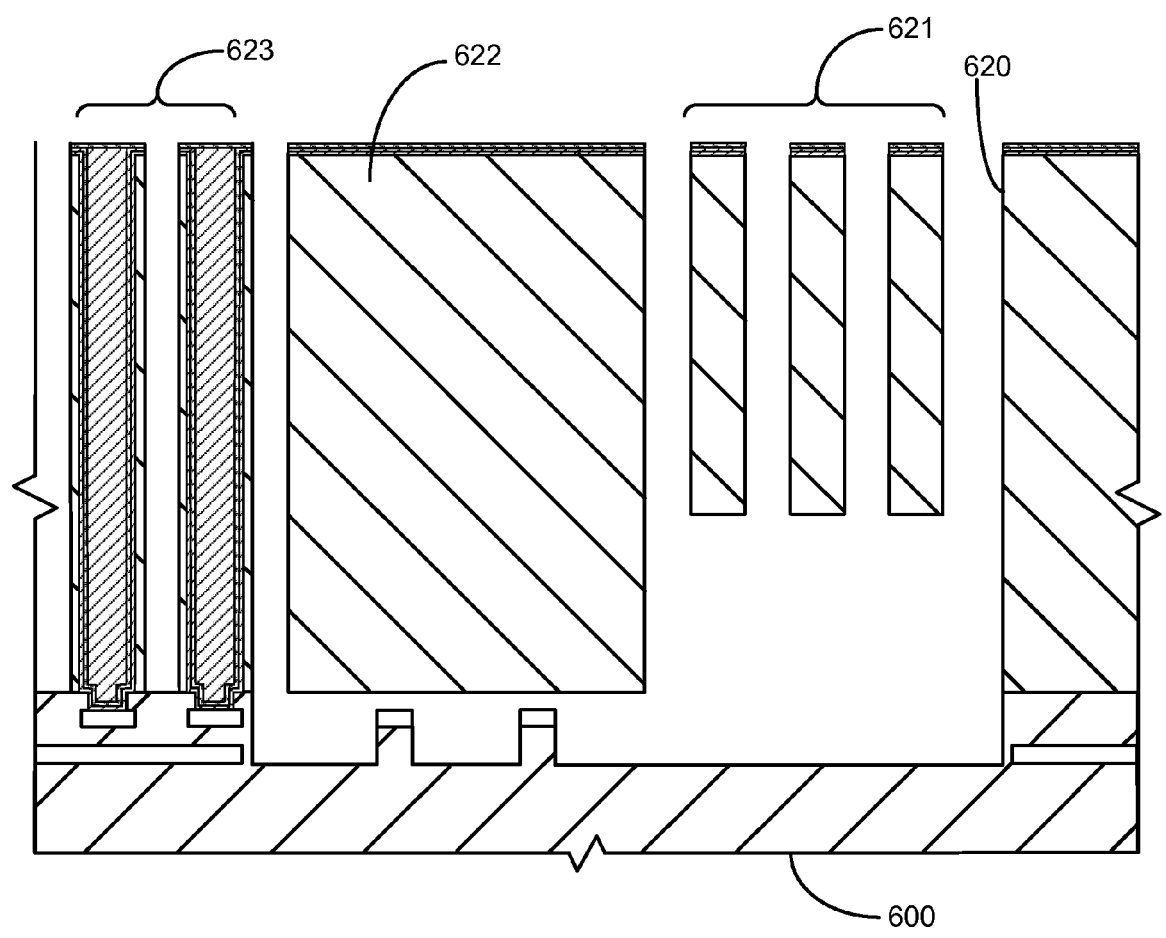

FIGS. 6A-6T show cross-sectional views of a micro electromechanical (MEMS) device during the fabrication process according to a third embodiment of the present invention. In the description that follows, processes that share one or more similarities with the processes discussed in relation to FIGS. 2A-2J are utilized. Accordingly, for similar processes, the description will be limited in the interest of brevity.

In the embodiment illustrated in FIGS. 6A-6T, a two-step via etch process is utilized in conjunction with a single via fill process to provide the electrical connectivity between the CMOS substrate and elements fabricated in the device substrate. CMOS substrate 600 including one or more electrodes and control circuitry 601 is covered with a photoresist layer 602 as illustrated in FIG. 6A. The photoresist layer is patterned to open up regions 603 as shown in FIG. 6B, which provide openings in which the via holes are etched to expose the electrodes 604 (FIG. 6C). Once the via holes are etched, the photoresist is stripped (FIG. 6D) and a new photoresist layer 605 is deposited (FIG. 6E) and patterned (FIG. 6F) and etched to form a cavity 606 as illustrated in FIG. 6G. The second photoresist layer 605 is stripped as illustrated in FIG. 6H. In some embodiments, the two photoresist deposition/photoresist patterning/feature etch sequences illustrated in FIGS. 6A-6C and 6E-6G are combined into a single sequence. One of ordinary skill in the art would recognize many variations, modifications, and alternatives.

Referring to FIG. 6H, standoff regions 608 are illustrated at peripheral portions of the structure as well as stops 607, which are disposed in the cavity 606 and are used to limit the motion of the MEMS elements in the vertical direction. These stops are exemplary of motion stops that can be positioned in other locations to limit the out-of-plane motion, which could adversely impact device operation.

A device substrate 609 is bonded to the processed CMOS substrate 600 as illustrated in FIG. 6I. The wafer bonding techniques discussed above are applicable to the substrate bonding process illustrated here. As shown in FIG. 6I, the device substrate is pre-patterned in order to provide for differences in spring constants or the like. The device substrate can be a single crystal silicon wafer, a polysilicon wafer, combinations thereof, or the like. In the embodiment illustrated in FIG. 6I, a dopant etch stop layer is formed using a heavily doped p-type layer although other approaches for thinning of the device substrate could be utilized. The device substrate 609 is thinned using grinding, etching, combinations thereof, or the like as illustrated in FIG. 6J to reduce the thickness of the devices that will subsequently be fabricated.

A photoresist layer 610 is deposited (FIG. 6K) and patterned (FIG. 6L) to provide a mask for the via etch process illustrated in FIG. 6M. The vias extend to the electrodes in the CMOS substrate and are aligned so that the second via etch process illustrated in FIG. 6M aligns with the first via etch process illustrated in FIG. 6C. Typically, the width of the second vias will be wider than the first vias to ensure overlap between the two etch processes. The photoresist is stripped (FIG. 6N) and a Ti adhesion layer 612 is deposited as a conformal layer to provide electrical connectivity between the electrodes in the CMOS substrate and the devices that will be formed in the device substrate (FIG. 6O). In some embodiments, adhesion layer 612 facilitates the adhesion of subsequent layers to the device substrate. A TiN barrier layer 613 is deposited as a conformal layer (FIG. 6P) and a W layer 614 is blanket deposited to fill the vias as illustrated in FIG. 6Q. After via filling, an etch back process is used to planarize the upper surface of the device substrate (FIG. 6R) and a TiN overlay 615 is deposited to seal the via structures (FIG. 6S).

FIG. 6T illustrates the etching of the device substrate to form anchor points 620, comb fingers 621, 623, springs, a proof mass 622, and other elements of the MEMS device. As illustrated, some elements (e.g., the moveable comb fingers) have a thickness that is less than the thickness of the proof mass, thereby increasing device sensitivity. The stops positioned below the proof mass prevent motion of the proof mass in the vertical direction by an amount greater than desired, thereby preventing damage to the device.

According to an embodiment of the present invention, a MEMS device is provided. The MEMS device includes a control substrate (e.g., a CMOS substrate) and a plurality of standoff structures coupled to the control substrate. The MEMS device also includes a first set of moveable elements coupled to the standoff structures via flexible members and a second set of elements coupled to the standoff structures. The first set of moveable elements are characterized by a first thickness and the second set of elements are characterized by a second thickness different from the first thickness.

The first set of moveable members may include a proof mass having a thickness ranging from about 5 μm to about 40 μm with a thickness of 30 μm in a particular embodiment. The second set of elements may be moveable and coupled to the standoff structures via flexible members, for example, a spring. The springs may have a thickness ranging from about 5 μm to about 40 μm with a thickness of 20 μm in a particular embodiment. Alternatively, the second set of elements may be fixed to the standoff structures, for example, anchor points. Both the first and second sets may include a single element.

The different thicknesses of various elements of the MEMS device provides for benefits not available using conventional techniques since the material properties can be varied for the various elements. As an example, a spring connecting the proof mass to the anchor points could have a reduced thickness in comparison to the comb fingers, resulting in an additional design variable that can be used to provide spring constants and resonance behaviors appropriate to the particular application. Thus, the various elements of the MEMS device, for example, an accelerometer, could have varying thicknesses including the proof mass, the springs, the proof mass comb fingers, the stator comb fingers, and the like. In a particular embodiment, different parts of the springs could have differing thicknesses in order to modify the spring constant. One of ordinary skill in the art would recognize many variations, modifications, and alternatives.

Figure 7A:
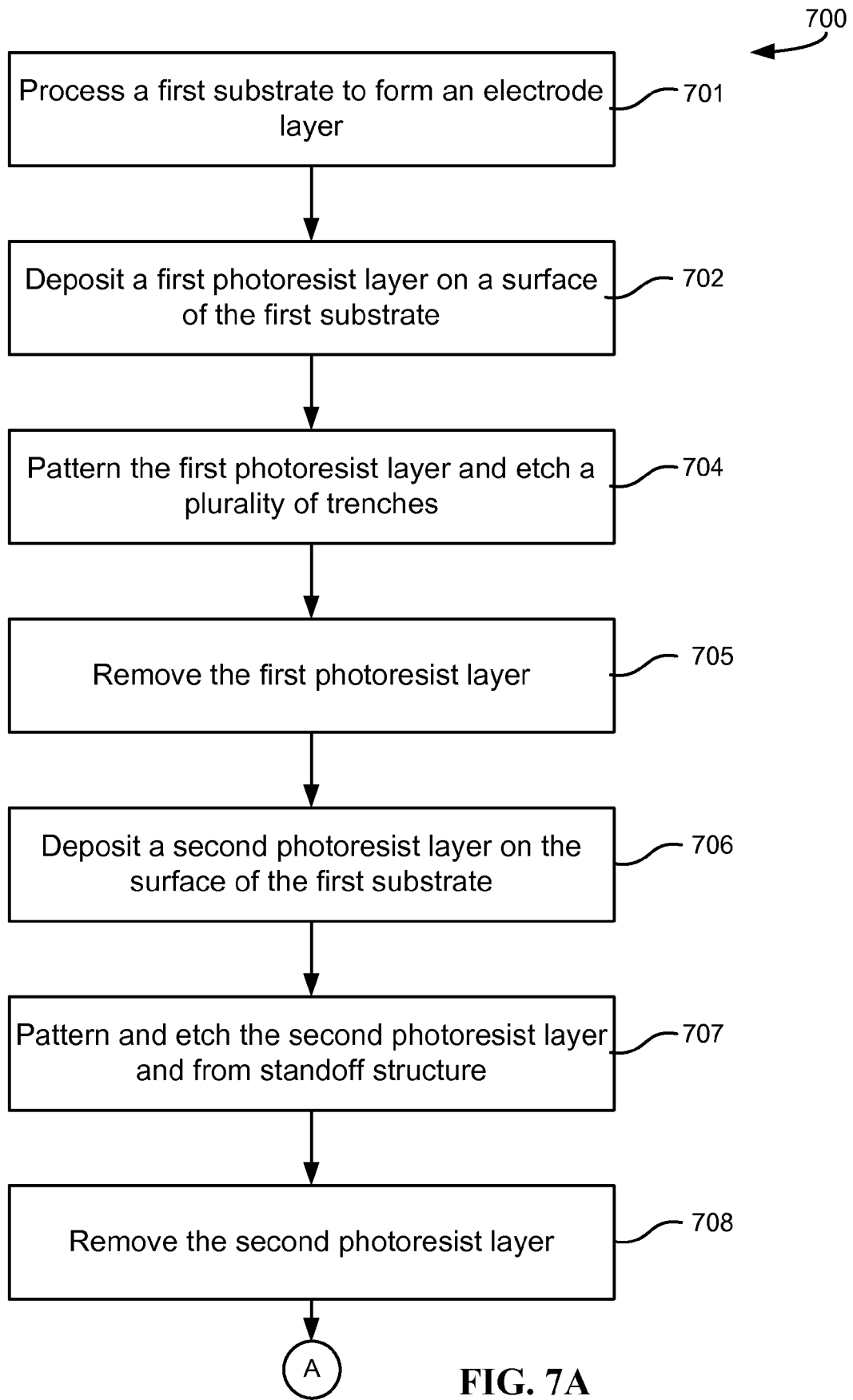
FIGS. 7A-7C illustrates a flow diagram of a process for fabricating the MEMS device of FIGS. 6A-6T according to an embodiment of the present invention.
Figure 7B:
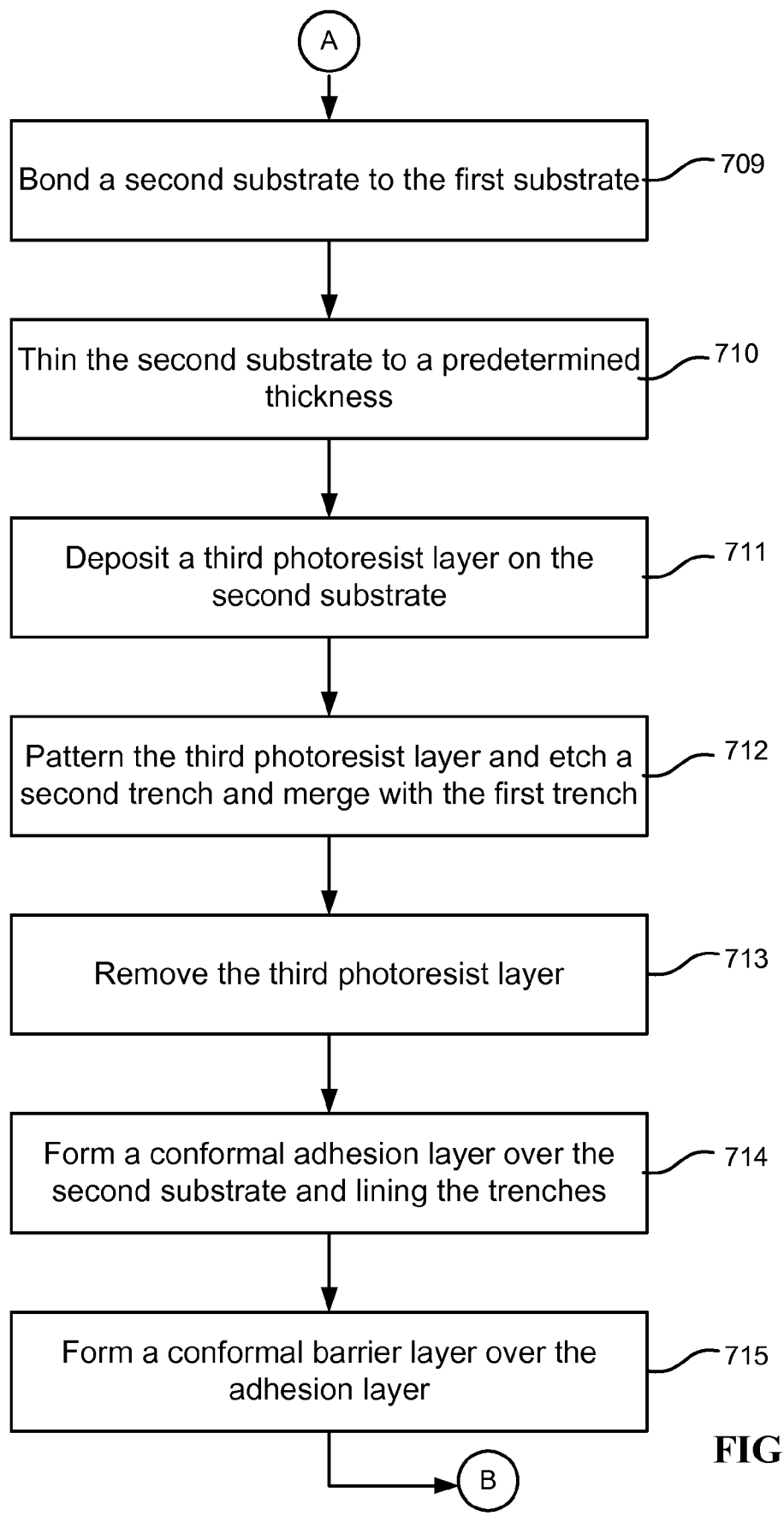
Figure 7C:
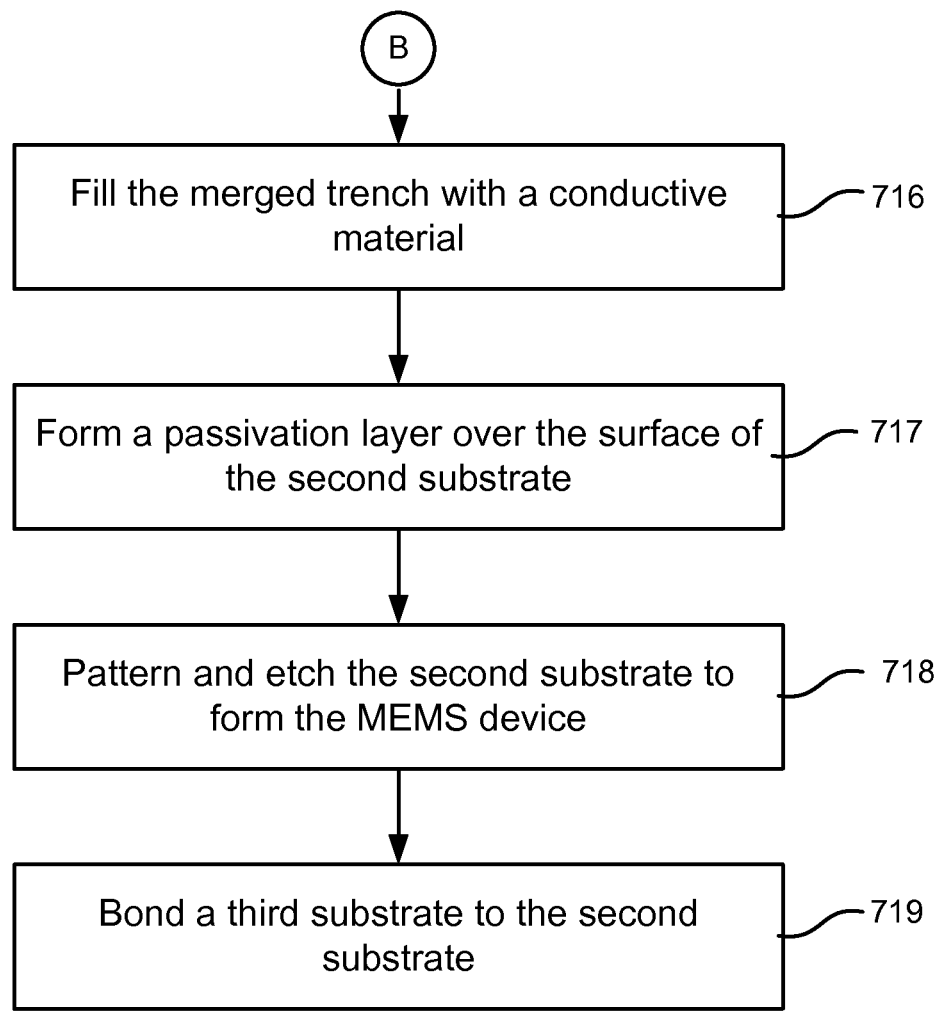

FIGS. 7A-7C shows flow diagram of a process 700 for fabricating a MEMS device illustrated in FIGS. 6A-6T according to an embodiment of the present invention. Process 700 includes providing a first substrate having one or more electrodes and control circuitry formed along a first surface (701). In some embodiments, the first substrate is a CMOS substrate. A first photoresist layer is formed over a surface of the first substrate (702). The first photoresist layer is patterned to define a first trench and the first trench is formed by etching the first photoresist layer and a portion of the first substrate (704). In some embodiments, the first trench extends to a first electrode from among the one or more electrodes. The remaining portion of the first photosensitive layer is then removed (705). Thereafter, a second photoresist layer is formed over the surface of the first substrate such that a portion of the second photoresist layer overlays the first trench (706). The second photoresist layer is patterned and etched along with a portion of the first substrate to form a plurality of standoff structures (707).

Thereafter, a second substrate is attached to the first substrate (709). The second substrate has an upper surface and a lower surface. The second substrate is then thinned to a predetermined thickness (710). A third photoresist layer is formed over the upper surface of the second substrate (711). The third photoresist layer is patterned and etched along with a portion of the second substrate to form a second trench (712). The second trench is aligned with the first trench and the second trench merges with the first trench to form a continuous trench extending from the upper surface of the second substrate to the first electrode. Following that, a conformal adhesion layer is formed over the upper surface of the second substrate and over sidewalls of the continuous trench (714). In some embodiments, the adhesion layer includes Titanium and is formed using conventional semiconductor techniques. A conformal barrier layer is formed over the adhesion layer (715). In some embodiments, the barrier layer includes titanium nitride (TiN). The merged continuous trench is filled with a conductive material (716). In some embodiments, the conductive material is tungsten. Thereafter a passivation/cap layer is formed over the barrier layer (717). A portion of the second substrate is etched to form a micro-electromechanical device (718). In some embodiments, the passivation/cap layer includes TiN formed using PVD or CVD techniques. In some embodiments, a third substrate is bonded to the second substrate to enclose the micro-electromechanical device (719).

It should be appreciated that the specific steps illustrated in FIGS. 7A-7C provide a particular method of fabricating a MEMS device according to an embodiment of the present invention. Other sequences of steps may also be performed according to alternative embodiments. For example, alternative embodiments of the present invention may perform the steps outlined above in a different order. Moreover, the individual steps illustrated in FIGS. 7A-7C may include multiple sub-steps that may be performed in various sequences as appropriate to the individual step. Furthermore, additional steps may be added or removed depending on the particular applications. One of ordinary skill in the art would recognize many variations, modifications, and alternatives.

FIGS. 8A-8G show cross-sectional views of a micro electromechanical (MEMS) device during the fabrication process according to a fourth embodiment of the present invention. In the process illustrated in FIGS. 8A-8G, a two-step process is used to form and fill vias in order to provide for electrical connectivity between the CMOS substrate and MEMS elements. Processes performed in relation to FIGS. 8A-8F share one or more similarities with the processes discussed in relation to FIGS. 2A-2J are utilized. Accordingly, for similar processes, the description will be limited in the interest of brevity.

Figure 8A:
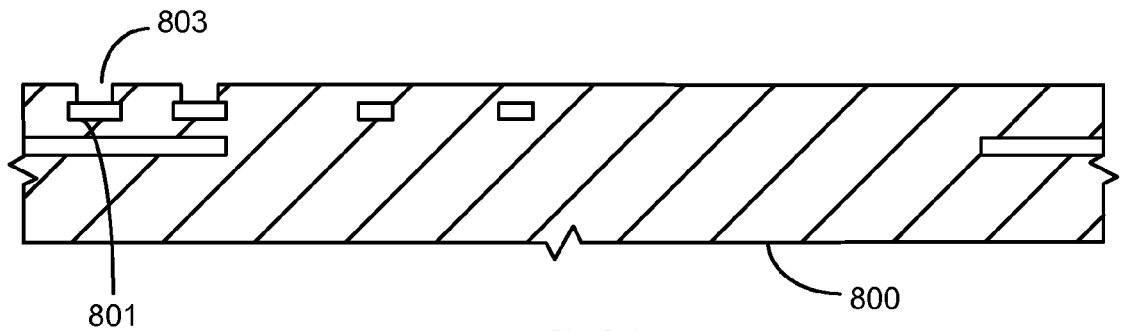
FIGS. 8A-8G show cross-sectional views of a micro electromechanical (MEMS) device during the fabrication process according to a fourth embodiment of the present invention.
Figure 8B:
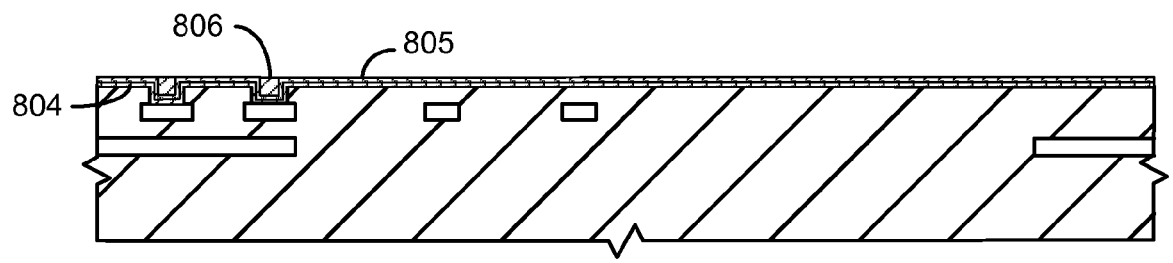
Figure 8C:
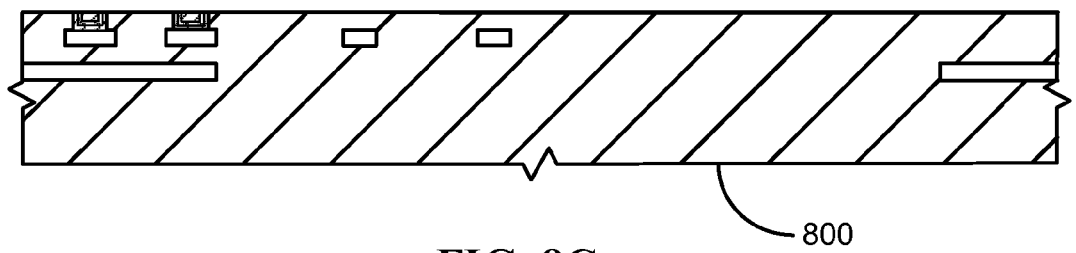
Figure 8D:
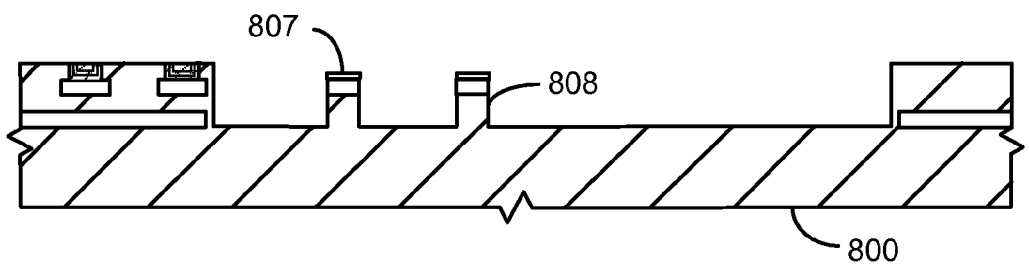
Figure 8E:
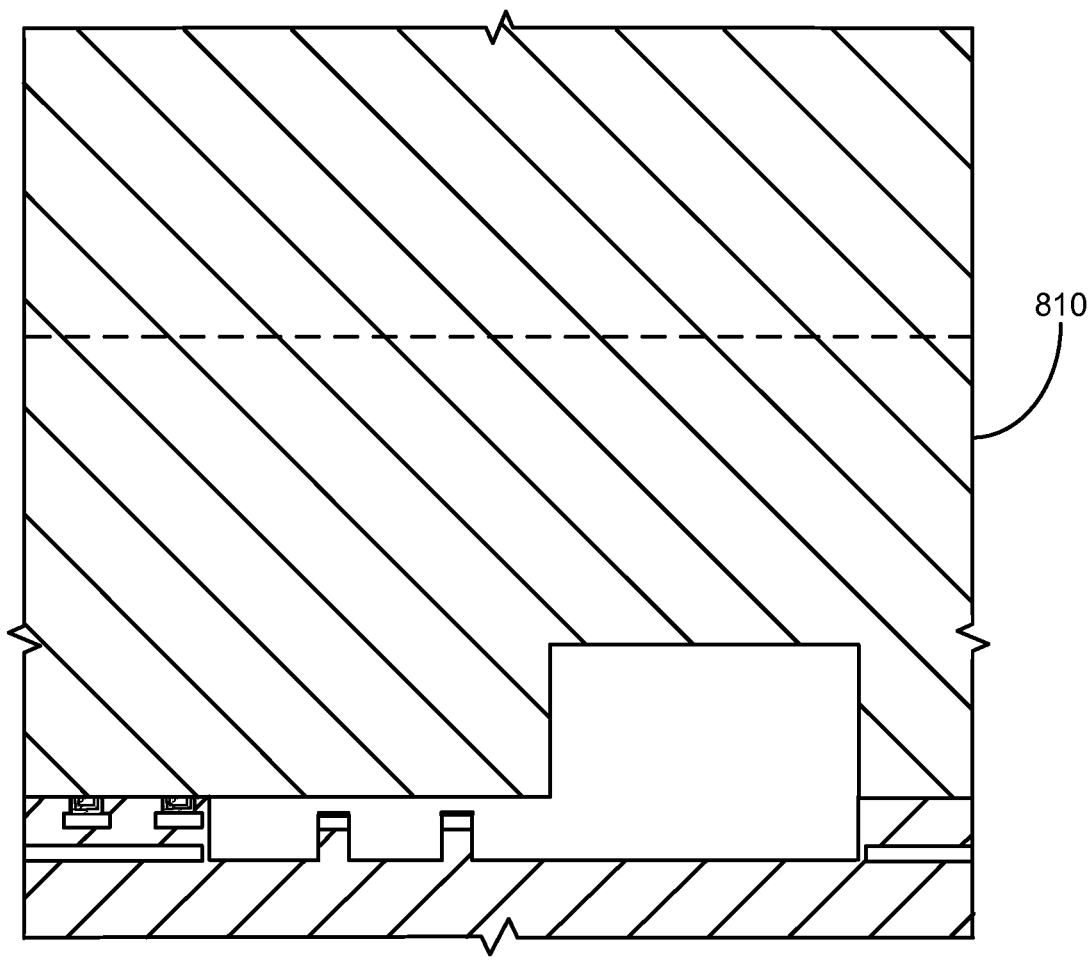

FIG. 8A illustrates a CMOS substrate 800 after etching of vias 803 using a photoresist coat/develop process and a via etch process. Electrodes 801 are thus exposed. Via filling using a Ti/TiN barrier (804/805) and W plugs (806) is illustrated in FIG. 8B. The Ti barrier layer is stripped as illustrated in FIG. 8C. A second photoresist coat/develop process and a cavity etch process is used to form the standoff structures and the motion stops 808 as shown in FIG. 8D. An additional oxide layer 807 is deposited to facilitate wafer bonding to the CMOS substrate 800. A substrate bonding process is used to form the composite substrate structure including the CMOS substrate 800 and device substrate 810 (FIG. 8E). The device substrate 810 has been pre-processed to include cavities in a surface of the substrate. Although a doped substrate is illustrated in FIG. 8E, other suitable device substrates can be utilized as described throughout the present specification.

Figure 8F:
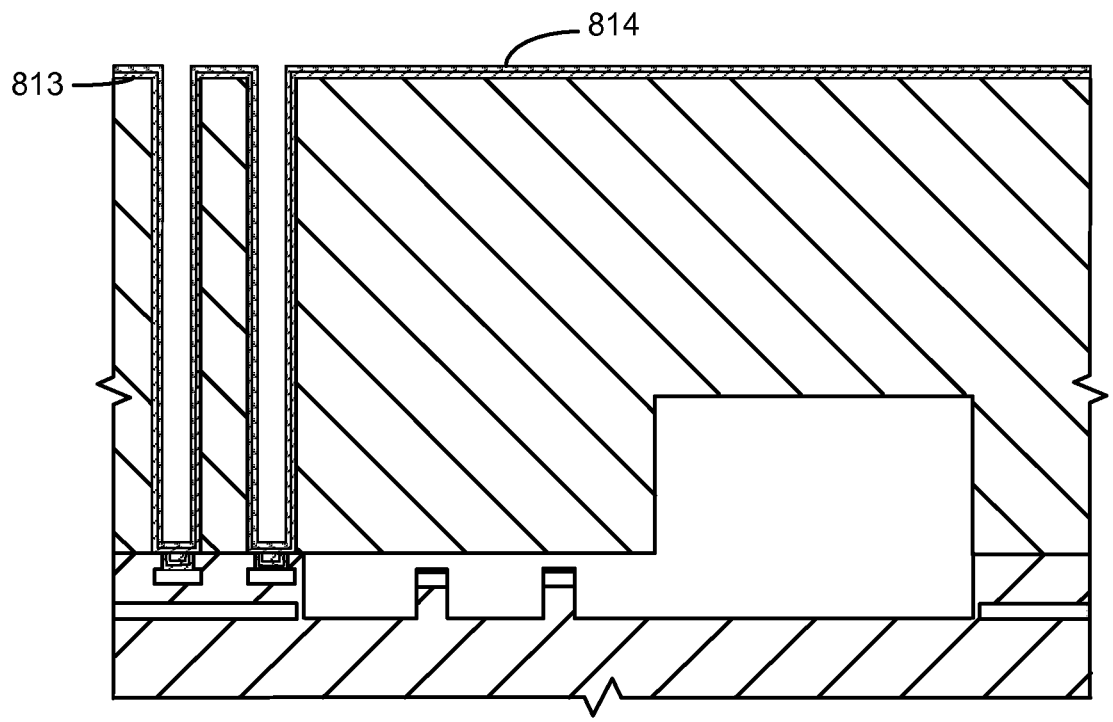
Figure 8G:
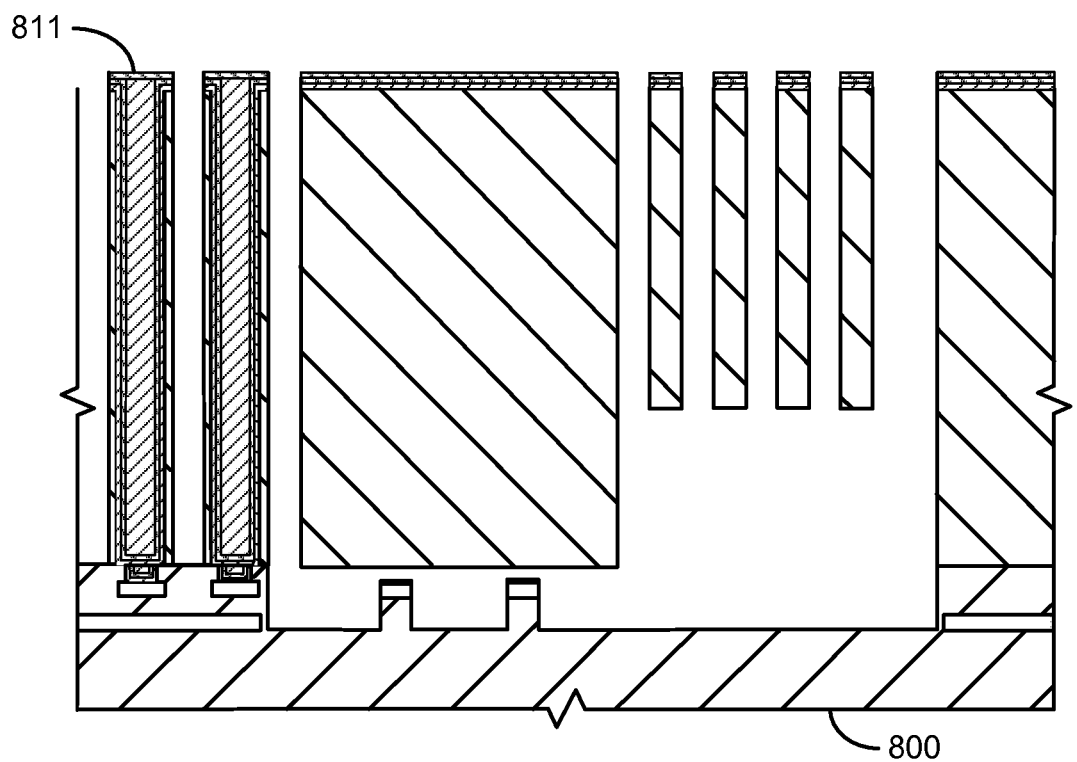

FIG. 8F illustrates the formation and filling of vias in the thinned device substrate. The Ti/TiN barrier layers 813/814 are illustrated as well. Referring to FIG. 8G, a TiN overlay (811) is deposited to seal the via structures and the device substrate is etched to form the various elements of the MEMS device. As discussed in relation to FIG. 6T, some elements have a reduced thickness as a result of the cavities formed in the device substrate prior to the wafer bonding process. Thus, a two-step via fill process can be used to fabricate MEMS devices in some embodiments of the present invention.

Figure 9A:
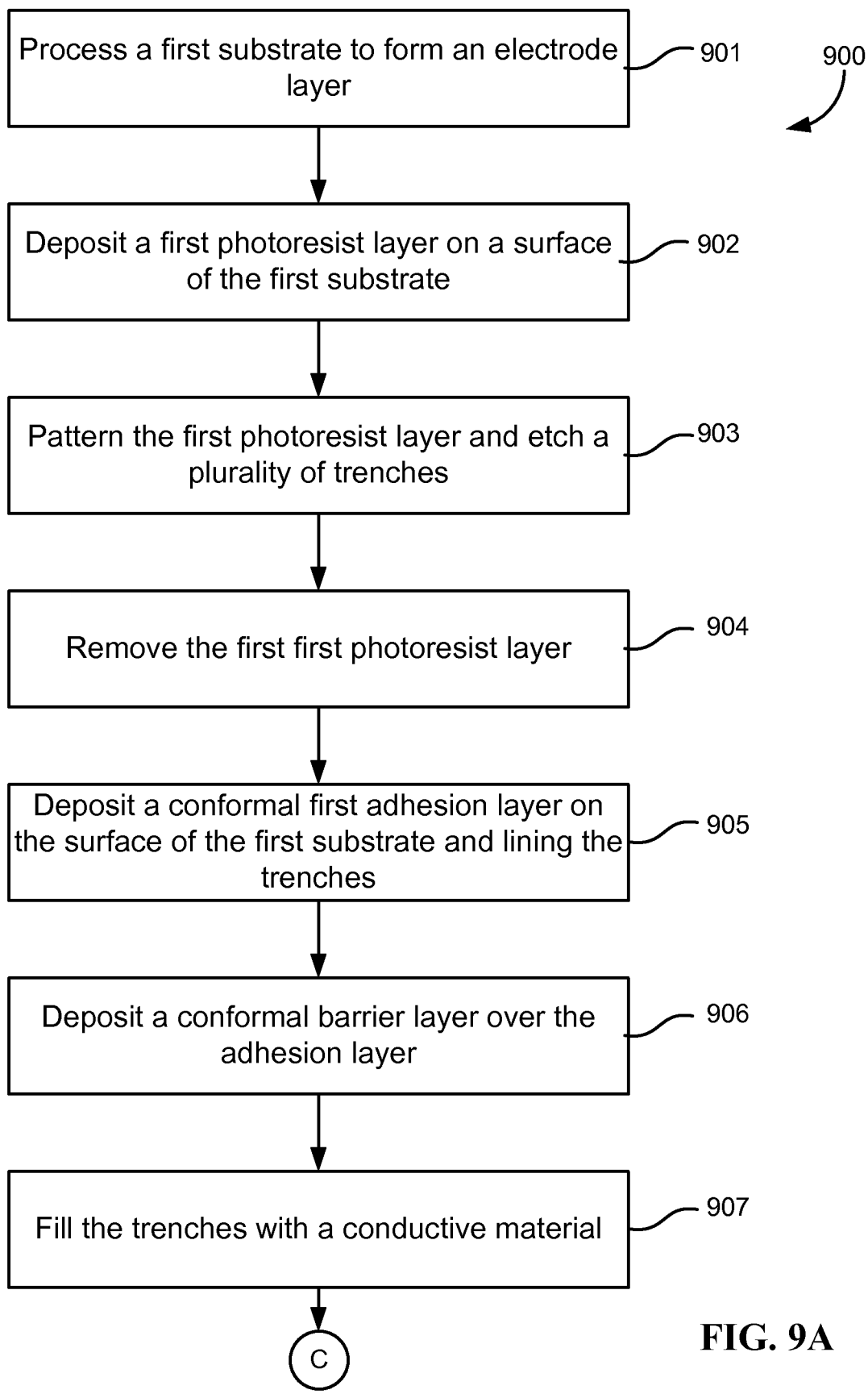
FIGS. 9A and 9B illustrate a flow diagram of a process for fabricating the MEMS device of FIGS. 8A-8Y according to an embodiment of the present invention.
Figure 9B:
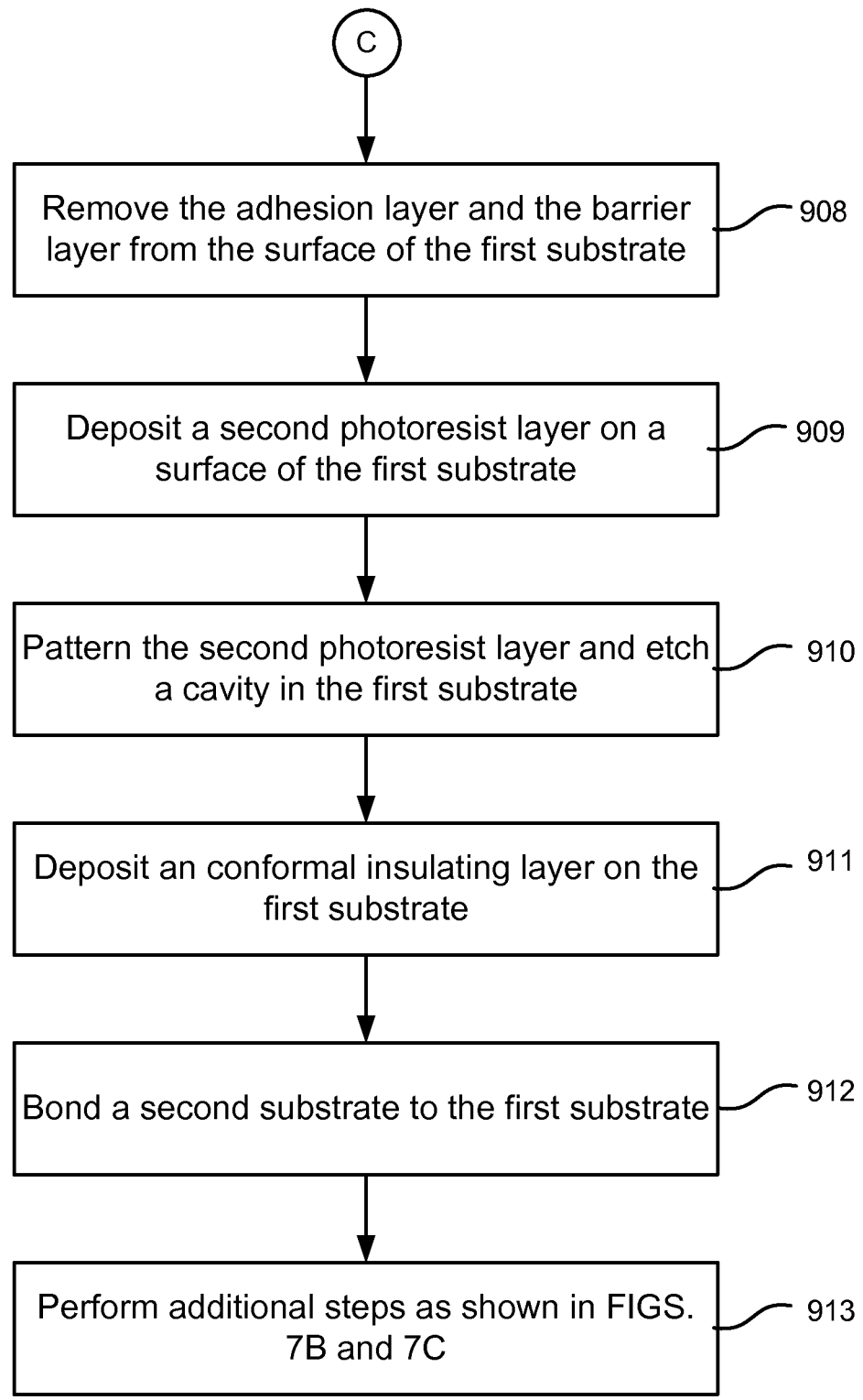

FIGS. 9A and 9B illustrate a flow diagram of a process 900 for fabricating the MEMS device of FIGS. 8A-8G according to an embodiment of the present invention. A first substrate is processed to form an electrode layer (901). A first photoresist layer is deposited (902) and patterned to provide an etch mask for etching of a plurality of trenches (903). The first photoresist layer is stripped (904) using a plasma ashing or other suitable process. A conformal adhesion layer, e.g., Ti, is deposited on the surface of the first substrate and as a liner in the trenches (905). A conformal barrier layer, e.g., TiN, is deposited over the adhesion layer (906). The trenches are then filled with a conductive material, e.g., a W plug (907). In other embodiments, alternative via fill processes are utilized. One of ordinary skill in the art would recognize many variations, modifications, and alternatives.

The adhesion layer and the barrier layer are removed from the surface of the first substrate (908) and a second photoresist deposition (909), patterning and etching (910) process is used to form standoff structures and associated cavities in the first substrate. A conformal insulating layer is deposited on the first substrate (911) to provide a bond interface for a wafer bonding process. The wafer bonding process is used to bond a second substrate to the first substrate (912). In order to finish the fabrication of the MEMS device, additional steps are performed as discussed in relation to FIGS. 7B and 7C.

It should be appreciated that the specific steps illustrated in FIGS. 9A and 9B provide a particular method of fabricating a MEMS device according to an embodiment of the present invention. Other sequences of steps may also be performed according to alternative embodiments. For example, alternative embodiments of the present invention may perform the steps outlined above in a different order. Moreover, the individual steps illustrated in FIGS. 9A and 9B may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 10A:
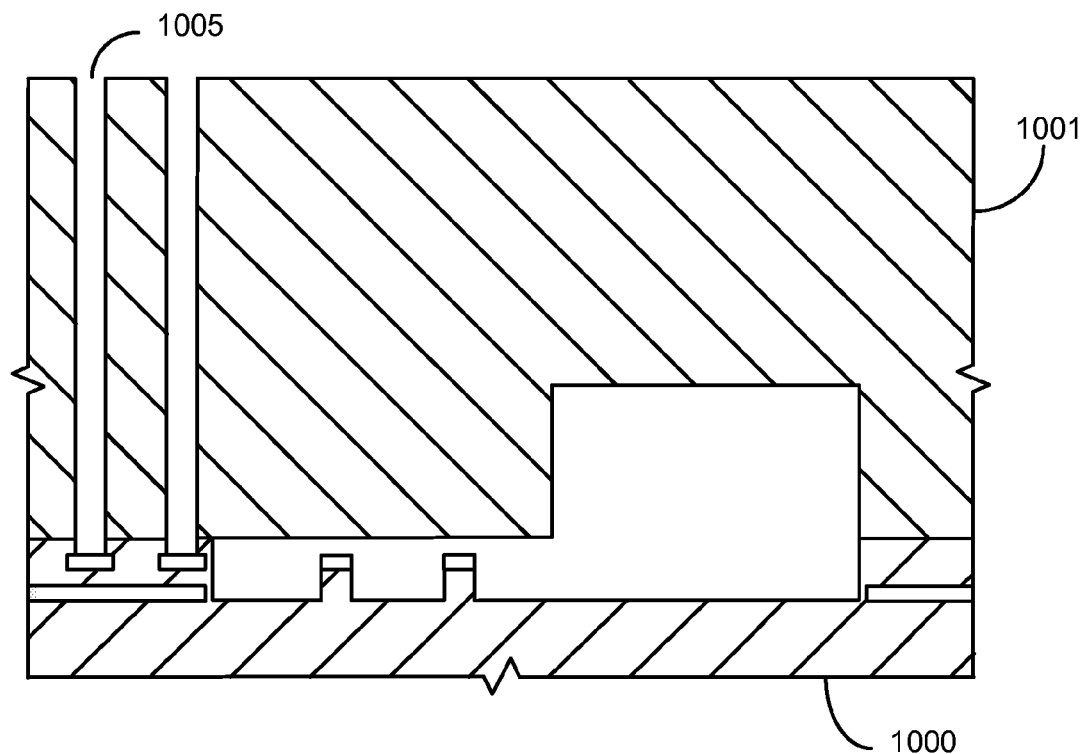
FIGS. 10A-10B show cross-sectional views of a micro electromechanical (MEMS) device during the fabrication process according to a fifth embodiment of the present invention.
Figure 10B:
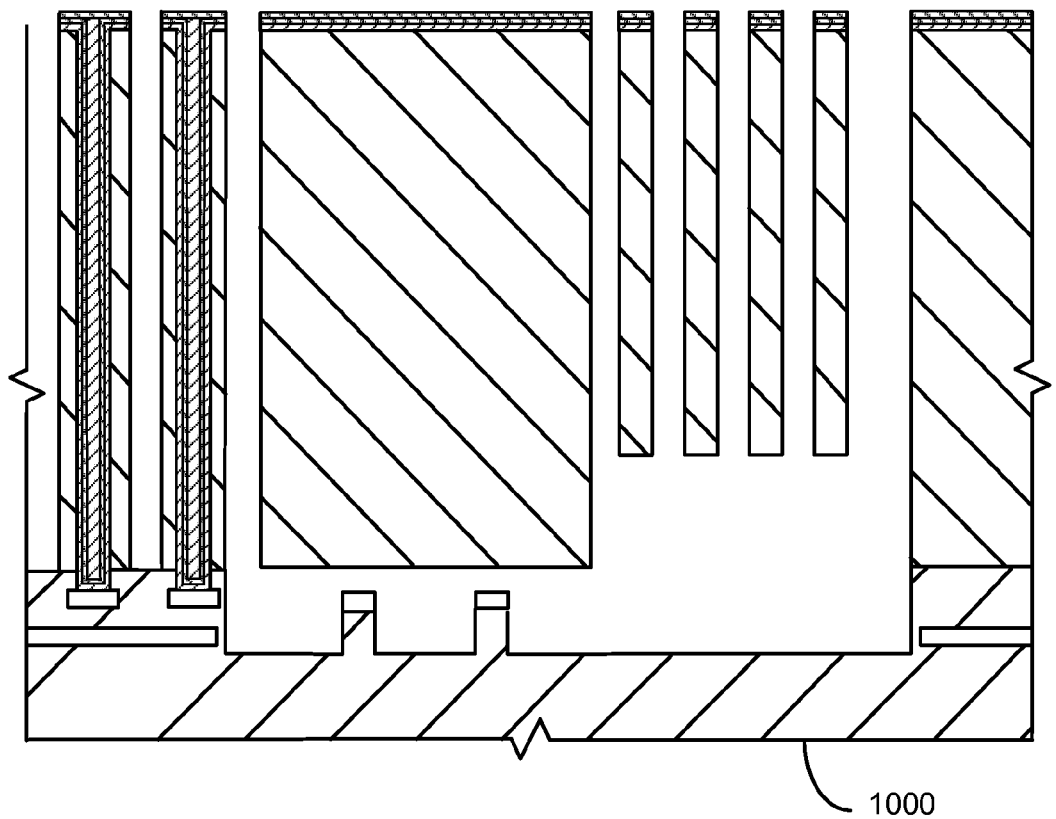

FIGS. 10A-10B show cross-sectional views of a micro electromechanical (MEMS) device during the fabrication process according to a fifth embodiment of the present invention. In the description that follows, processes that share one or more similarities with the processes discussed in relation to FIGS. 2A-2J are utilized. Accordingly, for similar processes, the description will be limited in the interest of brevity.

As illustrated in FIGS. 10A and 10B, a single via etch and fill process can be used to fabricate the MEMS device. Referring to FIG. 10A, a CMOS substrate 1000 and a device substrate 1001 are patterned and bonded together to form a composite substrate structure. Vias are etched through the device substrate and into the CMOS substrate in order to expose electrodes in the CMOS substrate. After filling the vias with conductive material, the elements of the MEMS structure are released to form, for example, an accelerometer.

Figure 11:
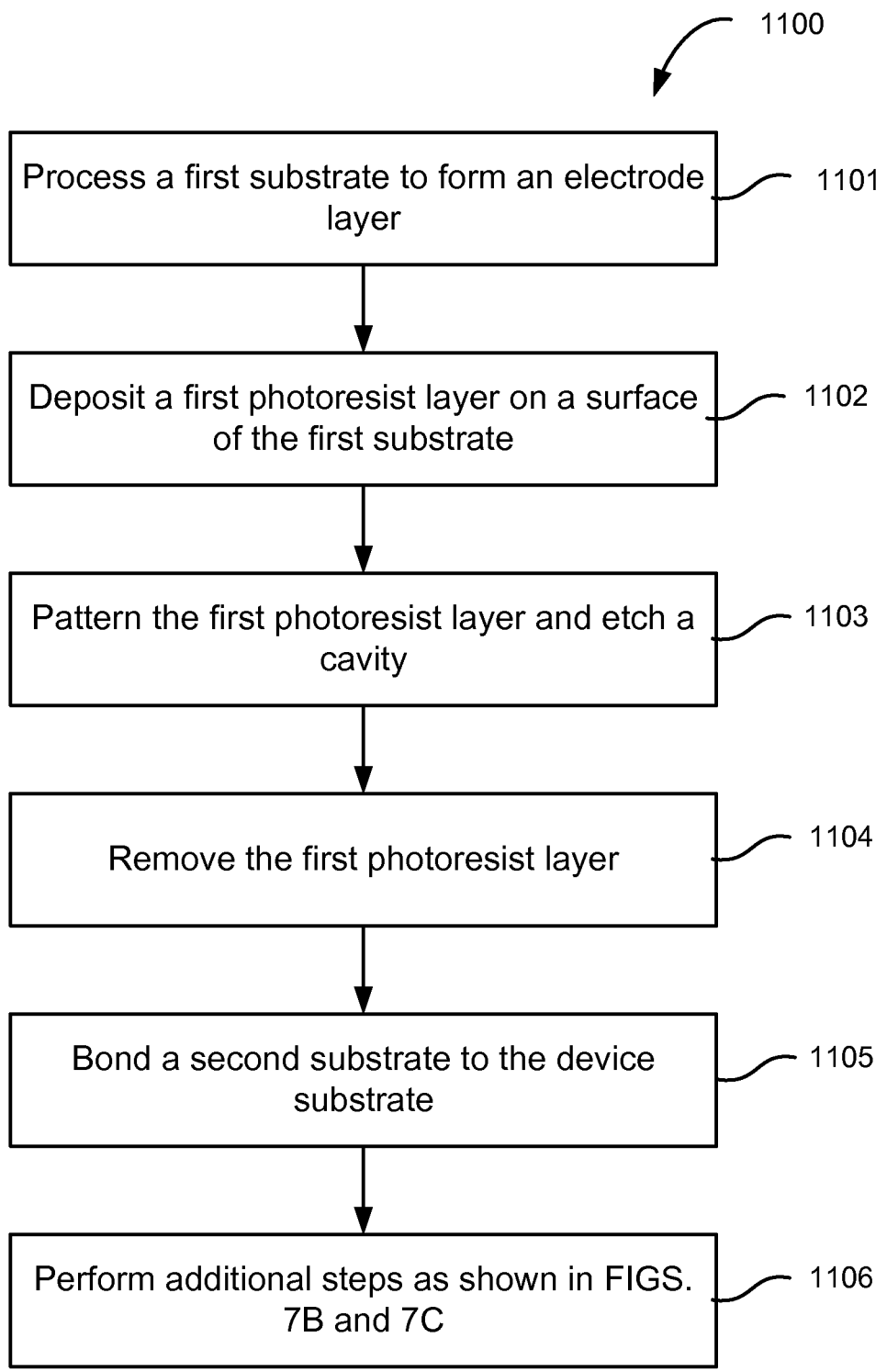
FIG. 11 illustrates a flow diagram of a process for fabricating the MEMS device of FIGS. 10A-10L according to an embodiment of the present invention.

FIG. 11 illustrates a flow diagram of a process 1100 for fabricating the MEMS device of FIGS. 10A-10L according to an embodiment of the present invention. A first substrate, e.g., a CMOS substrate is processed to form an electrode layer (1101). Typically, the fabrication of such a CMOS substrate is performed independently from other processing steps and the finished CMOS substrate is provided to a foundry for further processing as described herein. A photoresist layer is deposited (1102) and patterned on a surface of the first substrate. An etching process is then used to form standoff structures and cavities in the first substrate (1103).

After the photoresist layer is removed (1104), a wafer bonding process is utilized to form a composite substrate structure (1105). In order to form and fill the vias, additional steps are performed as discussed in relation to FIGS. 7B and 7C.

It should be appreciated that the specific steps illustrated in FIG. 11 provide a particular method of fabricating a MEMS device according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a device, the method comprising:
    providing a CMOS substrate having one or more electrodes and control circuitry formed in proximity to a first surface;
    forming a first photosensitive layer over the first surface of the CMOS substrate;
    patterning and etching the first photosensitive layer to form a first trench, the first trench extending to a first electrode from among the one or more electrodes;
    removing a remaining portion of the first photosensitive layer;
    forming a second photosensitive layer over the first substrate, wherein a portion of the second photosensitive layer overlays the first trench;
    etching the second photosensitive layer and a portion of the CMOS substrate to define a plurality of standoff structures;
    attaching a second substrate to the CMOS substrate, the second substrate having an upper surface and a lower surface;
    thinning the second substrate to a predetermined thickness;
    forming a third photosensitive layer over the upper surface of the second substrate;
    etching the third photosensitive layer and a portion of the second substrate to define a second trench; the second trench being aligned with the first trench, wherein the second trench merges with the first trench to form a continuous trench extending from the upper surface of the second substrate to the first electrode;
    forming a conformal adhesion layer over the upper surface of the second substrate and over sidewalls of the continuous trench;
    forming a conformal barrier layer over the adhesion layer;
    filling the continuous trench with a conductive material;
    forming a passivation layer over the barrier layer; and
    patterning and etching a portion of the second substrate to form a micro-electromechanical device.

2. The method of claim 1 wherein the first photosensitive layer comprises a photoresist layer.

3. The method of claim 1 wherein thinning of the second substrate comprises performing a CMP process.

4. The method of claim 1 wherein thinning of the second substrate comprises performing an RIE process.

5. The method of claim 1 wherein the micro-electromechanical device comprises an accelerometer.

6. The method of claim 5 wherein the accelerometer comprises a proof mass, stator comb fingers, and moveable comb fingers.

7. The method of claim 1 further comprising:
    bonding a cap wafer to a portion of the second substrate to form a packaged structure; and
    dicing the packaged structure to form individual dies.

8. The method of claim 7 wherein the individual dies include a plurality of accelerometers.

9. A method comprising:
    providing a first substrate having one or more electrodes and control circuitry formed in proximity to a first surface;
    forming a first photosensitive layer over the first surface of the first substrate;
    patterning and etching the first photosensitive layer to form a first trench, the first trench extending to a first electrode from among the one or more electrodes;

forming a second photosensitive layer over the first substrate, wherein a portion of the second photosensitive layer overlays the first trench;

etching the second photosensitive layer and a portion of the first substrate to define a plurality of standoff structures;

attaching a second substrate to the first substrate, the second substrate having an upper surface and a lower surface;

thinning the second substrate to a predetermined thickness;

forming a third photosensitive layer over the upper surface of the second substrate;

etching the third photosensitive layer and a portion of the second substrate to define a second trench; the second trench being aligned with the first trench, wherein the second trench merges with the first trench to form a continuous trench extending from the upper surface of the second substrate to the first electrode;

forming an adhesion layer over the upper surface of the second substrate and over sidewalls of the continuous trench;

forming a barrier layer over the adhesion layer;

filling the continuous trench with a conductive material; and patterning and etching a portion of the second substrate to form a micro-electromechanical device.

10. The method of claim 9 wherein the first substrate is a CMOS substrate.

11. The method of claim 9 further comprising forming a passivation layer over the barrier layer prior to the patterning and etching.

12. The method of claim 9 wherein the conductive material comprises one of Titanium, Titanium Nitride (TiN) or Tungsten (W).

13. The method of claim 9 wherein the micro-electromechanical device comprises a gyroscope.

* * * * *